United States Patent
Yamazaki et al.

(10) Patent No.: US 6,690,033 B2
(45) Date of Patent: Feb. 10, 2004

(54) ELECTRONIC DEVICE HAVING A LIGHT-EMITTING ELEMENT

(75) Inventors: Shunpei Yamazaki, Tokyo (JP); Jun Koyama, Kanagawa (JP); Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/788,681

(22) Filed: Feb. 21, 2001

(65) Prior Publication Data

US 2001/0025959 A1 Oct. 4, 2001

(30) Foreign Application Priority Data

Feb. 28, 2000 (JP) ........................ 2000-050584

(51) Int. Cl.$^7$ ................. H01L 29/04; G02F 1/136
(52) U.S. Cl. ............... 257/72; 257/59; 257/350; 349/43; 349/44; 349/110; 349/111
(58) Field of Search .................... 257/72, 69, 204, 257/350, 336, 337, 338, 368, 369, 59; 349/43, 44, 110, 111

(56) References Cited

U.S. PATENT DOCUMENTS

| | | | |
|---|---|---|---|
| 5,643,826 A | 7/1997 | Ohtani et al. ............... | 438/162 |
| 5,650,636 A | 7/1997 | Takemura et al. | |
| 5,712,495 A | 1/1998 | Suzawa | |
| 5,777,701 A | 7/1998 | Zhang | |
| 5,815,226 A | 9/1998 | Yamazaki et al. | |
| 5,856,689 A | 1/1999 | Suzawa | |
| 5,923,962 A | 7/1999 | Ohtani et al. ............... | 438/150 |
| 5,998,841 A | 12/1999 | Suzawa | |
| 6,104,461 A | 8/2000 | Zhang et al. | |
| 6,118,506 A | 9/2000 | Yamazaki et al. | |
| 6,175,395 B1 | 1/2001 | Yamazaki et al. | |
| 6,274,887 B1 * | 8/2001 | Yamazaki et al. ............ | 257/72 |
| 6,278,131 B1 * | 8/2001 | Yamazaki et al. ............ | 257/59 |
| 6,281,552 B1 * | 8/2001 | Kawasaki et al. .......... | 257/350 |
| 6,323,515 B1 | 11/2001 | Yamazaki et al. | |
| 6,384,818 B1 * | 5/2002 | Yamazaki et al. .......... | 345/206 |
| 6,392,255 B1 * | 5/2002 | Shibata et al. ............. | 257/350 |
| 2002/0044230 A1 * | 4/2001 | Yamazaki et a. ............. | 349/43 |

FOREIGN PATENT DOCUMENTS

| | | | |
|---|---|---|---|
| EP | 1 058 484 A1 * | 6/2000 | ........... H01L/33/22 |
| EP | 1 028 469 A2 | 8/2000 | |
| EP | 1 058 310 A2 | 12/2000 | |
| JP | 10-189252 | 7/1998 | |
| JP | 11-97698 | 4/1999 | |

OTHER PUBLICATIONS

U.S. patent application Ser. No. 09/671,780, Shibata et al., pending.
U.S. patent application Ser. No. 09/840,641, Yamazaki et al., pending.
Japanese Patent Application Laid–Open No. 07–130652 (English Abstract attached).
Japanese Patent Application Laid–Open No. 10–189252 (English Abstract attached).
Japanese Patent Application Laid–Open No. 10–270363 (English Abstract attached).
Japanese Patent Application Laid–Open No. 8330602 (English Abstract attached).
U.S. patent application Ser. No. 09/773,543; Shunpei Yamazaki et al.; filed on Feb. 2, 2001.

* cited by examiner

*Primary Examiner*—Eddie Lee
*Assistant Examiner*—Joseé R Diaz
(74) *Attorney, Agent, or Firm*—Fish & Richardson P.C.

(57) ABSTRACT

There is provided an electronic device in which the deterioration of the device is prevented and an aperture ratio is improved without using a black mask and without increasing the number of masks. In the electronic device, a first electrode (113) is disposed on another layer different from the layer on which a gate wiring (145) is disposed as a gate electrode, and a semiconductor layer of a pixel switching TFT is superimposed on the gate wiring (145) so as to be shielded from a light. Thus, the deterioration of the TFT is suppressed, and a high aperture ratio is realized.

17 Claims, 13 Drawing Sheets

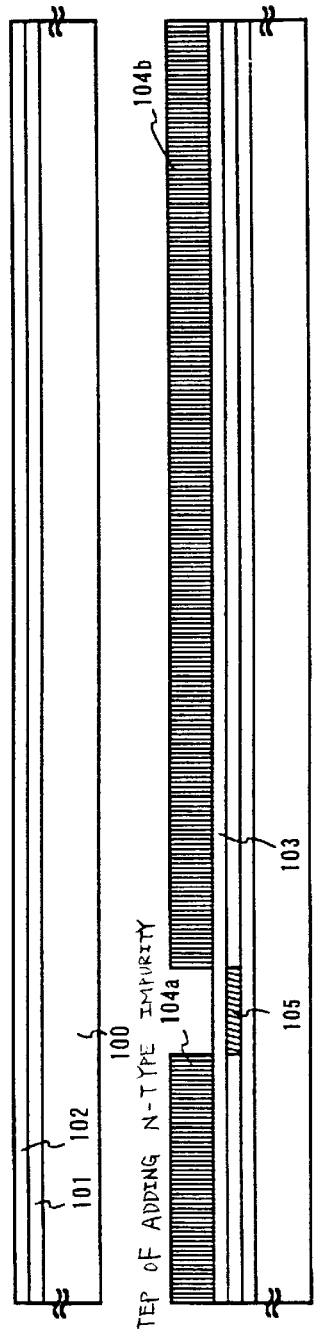

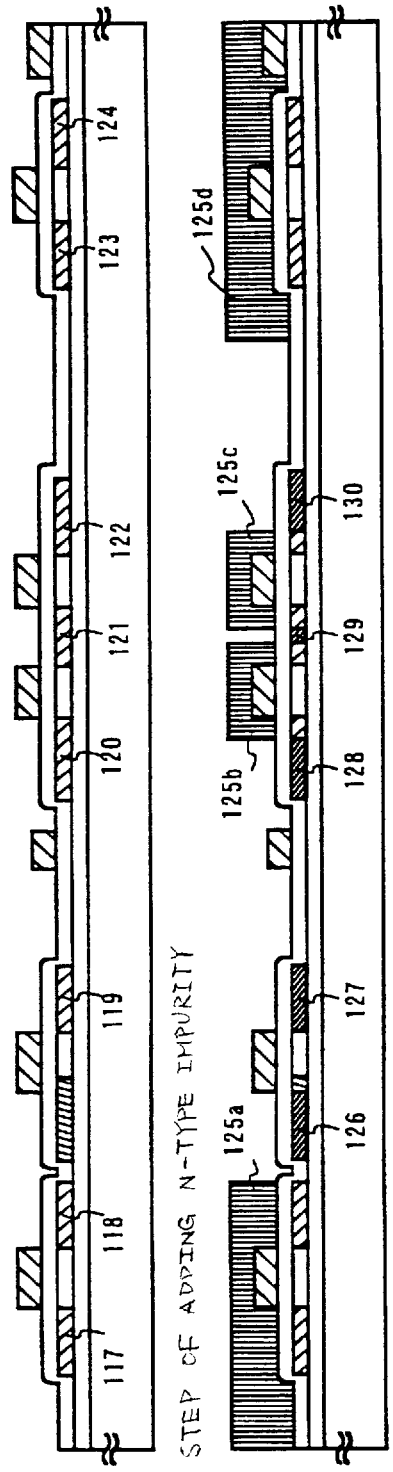
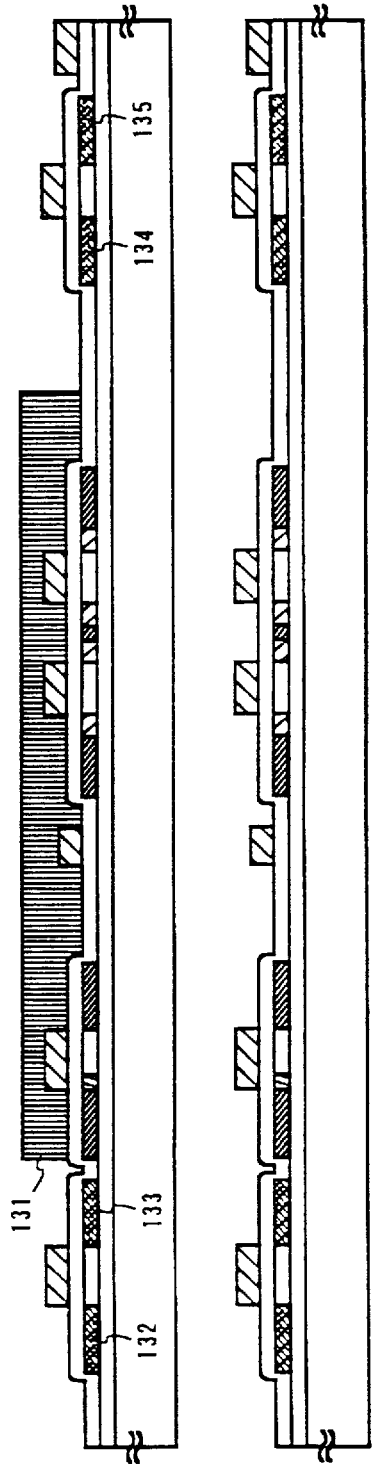
Fig. 4A  STEP OF ADDING N-TYPE IMPURITY
Fig. 4B  STEP OF ADDING N-TYPE IMPURITY
Fig. 4C
Fig. 4D

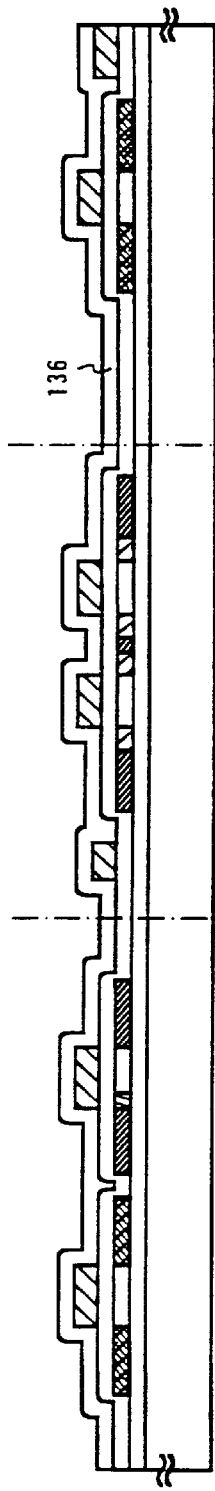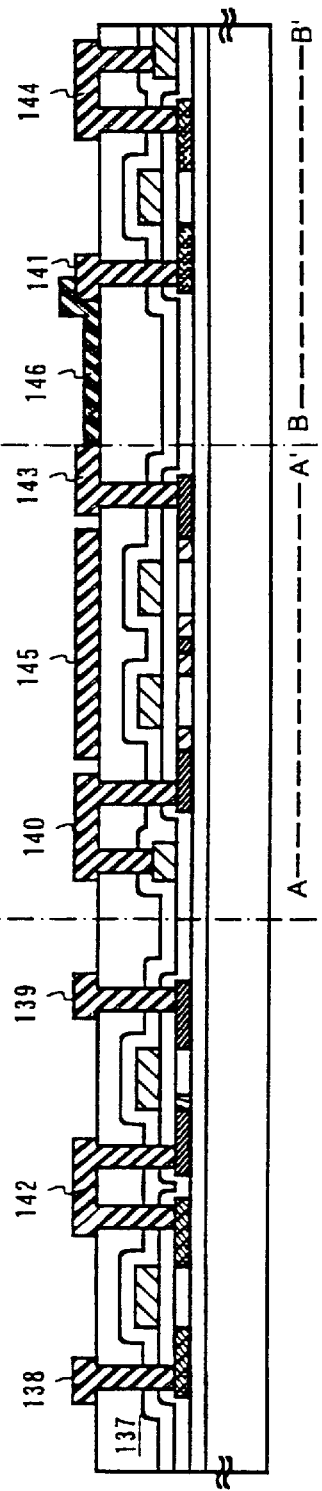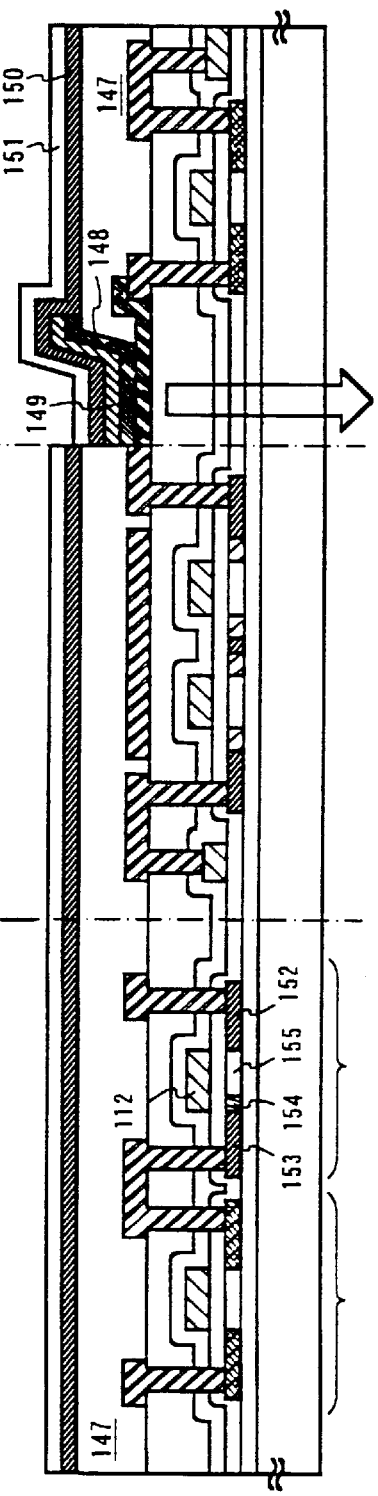

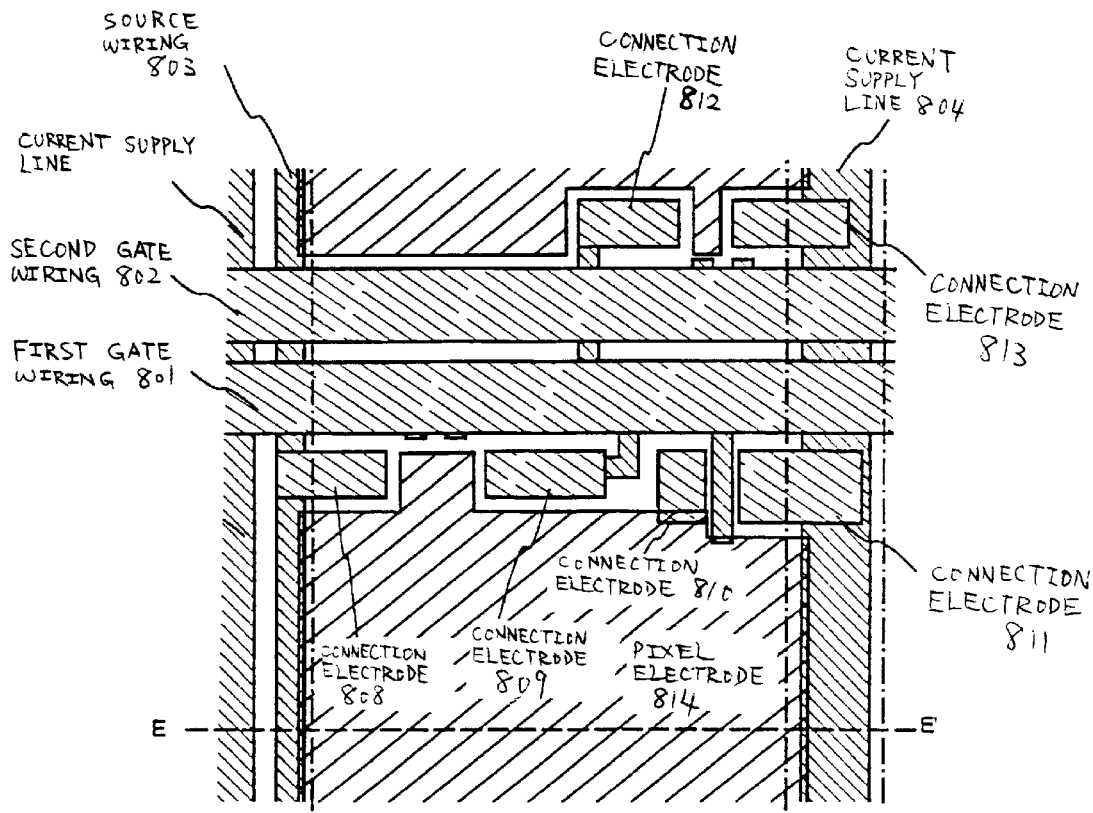
Fig. 10A TOP VIEW
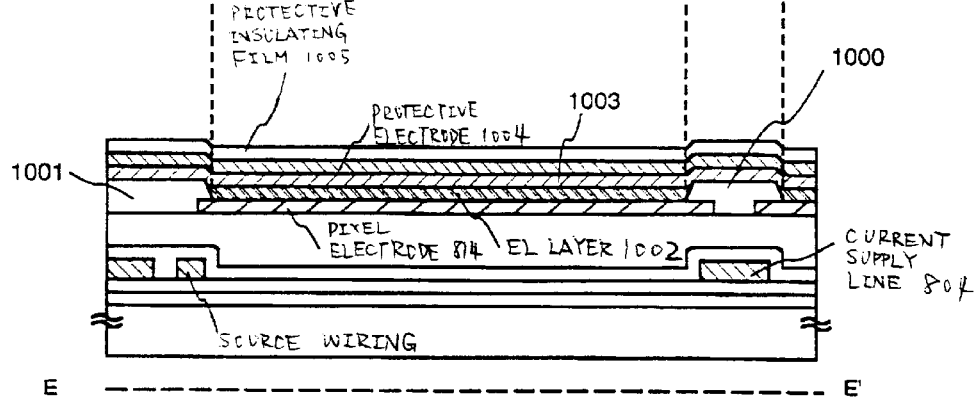
Fig. 10B E-E' CROSS-SECTIONAL VIEW

ELECTRONIC DEVICE HAVING A LIGHT-EMITTING ELEMENT

BACKGROUND OF THE INVENTION

1. Field of the Invention

The present invention relates to an EL (electro luminescence) display device having a semiconductor element (an element using a semiconductor thin film) formed on a substrate, and electric equipment using the EL display device as a display (display portion). The EL (electroluminescent) devices referred to in this specification include triplet-based light emission devices and/or singlet-based light emission device, for example.

2. Description of the Related Art

In recent years, a technique by which a TFT is formed on a substrate has greatly progressed, and the application of that technique to an active matrix display device has been increasingly developed. In particular, a TFT using a poly-silicon film enables high-speed operation since it is higher in field effect mobility (also called mobility) than a conventional TFT using an amorphous silicon film.

Attention has been paid to the above active matrix display device because various advantages such as a reduction in manufacturing costs, a downsizing of the display device, an improvement in yield, and a reduction in through-put, are obtained by forming various circuits and elements on the same substrate.

The active matrix EL display device provides a switching element formed of a TFT (hereinafter referred to as a switching element) on each of pixels and activates a driver element that conducts a current control by the switching TFT, to thereby make an EL layer (speaking rigidly, a light emitting layer) emit light. For example, Japanese Patent Application Laid-open No. Hei 10-189252 discloses the EL display device.

As the active matrix EL display device, there are proposed two EL element structures depending on light radiating directions. One of those structures is that a light emitted from the EL element penetrates an opposing substrate and is then radiated so as to enter eyes of an observer. In this case, the observer can recognize an image from the opposing substrate side. The other structure is that a light emitted from the EL element penetrates an element substrate and is then radiated so as to enter eyes of the observer. In this case, the observer can recognize an image from the element substrate side.

In the former structure, the light from the outside penetrates the opposing substrate and is then irradiated onto the TFTs existing in gaps between the respective pixel electrodes, to thereby deteriorate the TFTs. However, because the light from the outside is not high in intensity, the deterioration of the TFTs is not large.

On the other hand, in the latter structure generally frequently employed, because the light emitted from the EL element penetrates the element substrate and is then radiated, the light emitted from the EL element is irradiated onto the TFTs, resulting in such a serious problem in that the TFTs are deteriorated.

Also, a storage capacitor is provided in the pixel and a high aperture ratio is demanded for the pixel from the viewpoint of the display performance. If the respective pixels have the high aperture ratio, the light application efficiency is improved, thereby being capable of achieving the power saving and the downsizing of the display device.

In recent years, the fine pixel size is developed, and a higher definition image is demanded. The fine pixel size increases an area of one pixel on which the TFT and the wirings are formed, to thereby reduce the pixel aperture ratio.

Under the above circumstances, in order to obtain the high aperture ratio of each pixel within the limit of a regular pixel size, it is essential to efficiently layout circuit elements necessary for the circuit structure of the pixel.

As described above, in order to realize the active matrix EL display device high in pixel aperture ratio with a small number of masks, an entirely novel pixel structure that has not existed up to now is demanded.

SUMMARY OF THE INVENTION

The present invention has been made to meet the above demands, and therefore an object of the present invention is to provide an EL display device having a pixel structure that realizes a high aperture ratio without increasing the number of masks and the number of processes.

In order to solve the problems with the conventional art, the present invention provides the following means.

The present invention is characterized by a pixel structure in which gaps between respective TFTs and gaps between respective pixels are shielded from a light without using a black mask. As one means for shielding the TFTs from the light, a gate electrode and source wirings are formed on a first insulating film, and most of a semiconductor layer that serves as an active layer is covered with gate wirings formed on a second insulating film different from the first insulating film. Also, as one means for shielding the gaps between the respective pixels from the light, pixel electrodes are so disposed as to be superimposed on the source wirings.

The above-mentioned TFTs are directed to switching TFT disposed on the respective pixels or current control TFTs.

According to the structure of the present invention disclosed in this specification, there is provided an electronic device comprising a plurality of source wirings, a plurality of gate wirings, a plurality of current supply lines and a plurality of pixels, characterized in that:

each of the plurality of pixels includes a switching TFT, a current control TFT, and a light-emitting element; and the switching TFT includes a semiconductor layer (first semiconductor layer 200) having a source region and a drain region on an insulating surface, and a channel-forming region interposed between the source region and the drain region; a first insulating film (gate insulating film) formed on the semiconductor layer (first semiconductor layer 200); an electrode formed (first electrode 113) on the first insulating film so as to be superimposed on the channel-forming region; a source wiring (115) formed on the first insulating film; a second insulating film that covers the electrode (first electrode 113) and the source wirings; and a gate wiring (145) formed on the second insulating film and connected to the electrode (first electrode 113).

In the above structure, the electronic device is characterized in that the semiconductor layer (first semiconductor layer 200) has a region, which is superimposed on the gate wiring.

Further, the electronic device is characterized in that the region of the semiconductor layer which is superimposed on the gate wiring includes at least the channel-forming region, a region existing between the channel-forming region and the drain region, or a region existing between the channel-forming region and the source region, and is protected from light from the outside.

In case of the electronic device of a multi-gate structure in which a plurality of gate electrodes are on one semiconductor layer through an insulating film, it is characterized in that the semiconductor layer includes a plurality of channel-forming regions that the gate wiring is so disposed as to be superimposed on a region existing between one of the channel-forming regions and another channel-forming region.

Further, the electronic device is characterized in that the electrode and the source wirings are made of the same material on the first insulating film and that the pixel electrode, the connection electrode and the gate wiring are made of the same material on the second insulating film.

According to another structure of the present invention, there is provided an electronic device comprising a plurality of source wirings, a plurality of first gate wirings, a plurality of current supply lines, a plurality of second gate wirings and a plurality of pixels, characterized in that:

each of the plurality of pixels includes a switching TFT, a current control TFT, an erasing TFT and a light-emitting element; and the switching TFT includes a semiconductor layer (first semiconductor layer 900) having a source region and a drain region formed on an insulating surface, and a channel-forming region interposed between the source region and the drain region; a first insulating film (gate insulating film) formed on the semiconductor layer (first semiconductor layer 900); an electrode (first electrode 805) formed on the first insulating film and superimposed on the channel-forming region; a source wiring (803) formed on the first insulating film; a second insulating film that covers the electrode (first electrode 805) and the source wiring (803); and a first gate wiring (801) formed on the second insulating film and connected to the electrode (first electrode 805).

Further, according to another structure of the present invention, there is provided an electronic device comprising a plurality of source wirings, a plurality of first gate wirings, a plurality of current supply lines, a plurality of second gate wirings and a plurality of pixels, characterized in that:

each of the plurality of pixels includes a switching TFT, a current control TFT, an erasing TFT, and a light-emitting element; and the erasing TFT includes a semiconductor layer having a source region and a drain region formed on an insulating surface, and a channel-forming region interposed between the source region and the drain region; a first insulating film (gate insulating film) formed on the semiconductor layer; a first electrode (third electrode 807) formed on the first insulating film and superimposed on the channel-forming region; a second electrode (second electrode 806) formed on the first insulating film; a second insulating film that covers the first electrode (third electrode 807) and the second electrode (second electrode 806); and a second gate wiring (802) formed on the second insulating film and connected to the first electrode (third electrode 807).

In the above structure, the electronic device is characterized in that the semiconductor layer has a region which is superimposed on the second gate wiring (802) and that the second gate wiring (802) is superimposed on at least the channel-forming region.

Further, the electronic device is characterized in that the region of the semiconductor layer which is superimposed on the second gate wiring (802) includes at least the channel-forming region, a region existing between the channel-forming region and the drain region, or a region existing between the channel-forming region and the source region, and is protected from light from the outside.

In the above structure, the first electrode (third electrode 807) that is superimposed on the channel-forming region comprises a gate electrode of the erasing TFT.

In the above structure, the second electrode (second electrode 806) comprises a gate electrode of the current control TFT, which is connected to the drain region of the switching TFT.

Further, it is characterized in that the first gate wiring and the second gate wiring are made of the same material in order to suppress the increase in the number of masks.

BRIEF DESCRIPTION OF THE DRAWINGS

These and other objects and advantages of this invention will become more fully apparent from the following detailed description taken with the accompanying drawings in which:

FIGS. 3A to 3E are diagrams showing a process of manufacturing an active matrix substrate in accordance with Embodiment 1 of the present invention;

FIGS. 4A to 4D are diagrams showing a process of manufacturing an active matrix substrate in accordance with Embodiment 1 of the present invention;

FIGS. 5A to 5C are diagrams showing a process of manufacturing an active matrix substrate in accordance with Embodiment 1 of the present invention;

FIGS. 10A and 10B are a top view and a cross-sectional view showing a pixel portion in accordance with Embodiment 8 of the present invention;

DETAILED DESCRIPTION OF THE PREFERRED EMBODIMENTS

A description will be given in more detail of preferred embodiments of the present invention with reference to the accompanying drawings.

An EL display device according to the present invention includes a pixel portion where pixels are arranged on an element substrate in matrix and a driving circuit that drives the pixel portion as a basic structure.

Two of switching TFTs and current control TFTs are formed on each of the pixels. In this structure, a drain of the switching TFT is electrically connected to a gate of the current control TFT. In addition, a drain of the current control TFT is electrically connected with a pixel electrode. Thus, the pixel portion is formed.

Also, the driver circuit for driving the pixel is formed of an n-channel TFT or a p-channel TFT.

Figure 1:
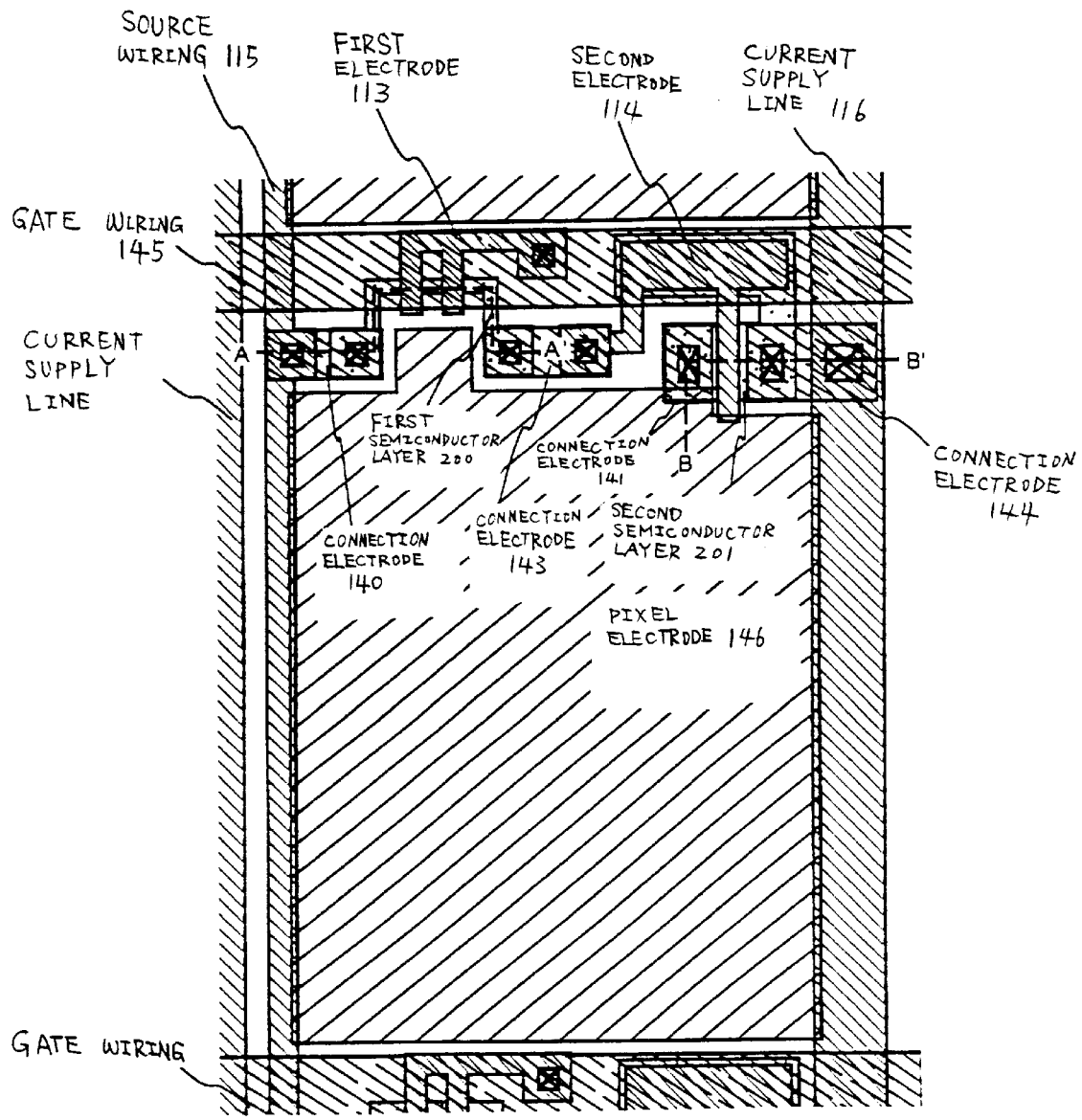
FIG. 1 is a top view showing a pixel portion in accordance with Embodiment 1 of the present invention.
Figure 2:
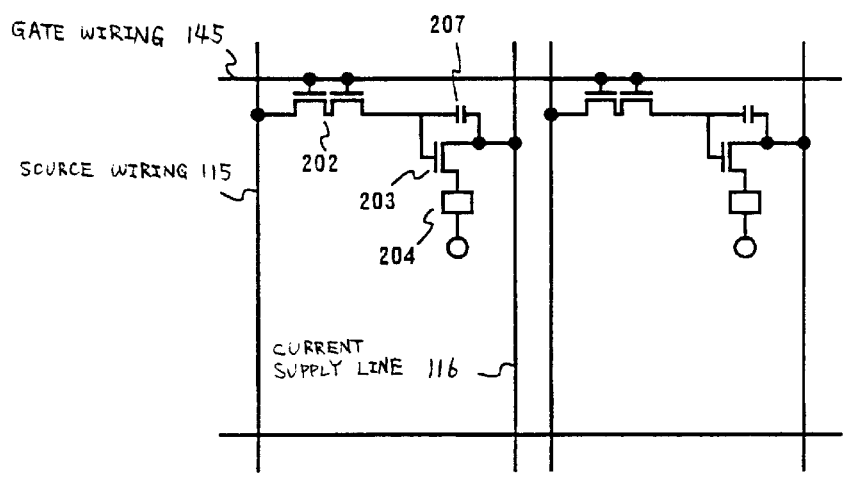
FIG. 2 is a diagram showing an equivalent circuit in the pixel portion in accordance with Embodiment 1 of the present invention.

A specific example of a pixel structure according to the present invention is shown in FIG. 1. Further, an equivalent circuit having the pixel structure shown in FIG. 1 is shown in FIG. 2. In this example, two TFTs are formed within the pixel, but a pixel structure in which three TFTs are formed within the pixel may be applied.

As shown in FIGS. 1 and 2, the pixel portion includes a gate wiring 145 disposed in a row direction, a source wiring 115 disposed in a column direction, a current supply line 116, a switching TFT 202 connected to the gate wiring 145 and the source wiring 115, a current control TFT 203 connected to a light-emitting element 204 and the current supply line 116, and a storage capacitor 207.

The gate wiring 145 shown in FIG. 1 is connected to an island-like first electrode 113 disposed in the row direction. Also, the gate wiring 145 is disposed on a second insulating film so as to be in contact with the latter. On the other hand, the island-like first electrode 113 is formed on a first insulating film (hereinafter referred to as a gate insulating film) so as to be in contact with the latter as in a source wiring 137 and the current supply line 116.

Also, a connection electrode 140 is formed on the second insulating film (hereinafter referred to as an interlayer insulating film) as in a connection electrode 141, a connection electrode 143, a connection electrode 144 and the gate wiring 145.

Further, a pixel electrode 146 is superimposed on the connection electrode 141 connected with the current control TFT so as to be in contact with the connection electrode 141. Also, an end portion of the pixel electrode 146 is superimposed on the source wiring 115. An EL layer, a cathode, a protective electrode and so on are formed with the pixel electrode 146 as an anode, to thereby complete an active matrix EL display device. In this specification, a light-emitting element formed of the anode, the EL layer and the cathode is called an EL element.

Further, the EL layer is normally of a laminate structure, and representatively, there is a laminate structure of "a hole transport layer/a light emitting layer/an electron transport layer" proposed by Tang et al of Eastman Kodak Company. As other structures, there are a structure in which a hole injection layer/a hole transport layer/a light emitting layer/an electron transport layer, and a structure in which a hole injection layer/a hole transport layer/a light emitting layer/an electron transport layer/an electron injection layer are laminated in the stated order. Further, the light emitting layer may be doped with a fluorescent pigment or the like. In this specification, all layers of the hole injection layer, the hole transport layer, the light emitting layer, the electron transport layer, the electron injection layer and so on are generically named the EL layer.

The pixel structure according to the present invention enables the active layer of the TFT to be superimposed on the gate wiring and to be shielded from a light.

In order to shield at least the switching TFT on the element substrate from the light, at least a channel-forming region of a first semiconductor layer 200 is so disposed as to be shielded from the light by the gate wiring 145. Also, it is desirable that a region (an LDD region, an offset region and the like) existing between the channel-forming region and the drain region, and a region existing between the channel-forming region and the source region are shielded from the light by the gate wiring 145, other than the channel-forming region. Further, because the structure shown in FIG. 1 is the multi-gate structure, a plurality of channel-forming regions exist on one semiconductor layer. Therefore, it is desirable to shield a region between one channel-forming region and another channel-forming region from the light by the gate wiring 145.

If the switching TFT is of the multi-gate structure, an off current of the switching TFT can be lowered. Also, if the current control TFT is of the multi-gate structure, the deterioration of the current control TFT due to heat can be suppressed.

The gate wiring 145 is formed on and in contact with an insulating film different from the insulating film on which the first electrode 113 that serves as the gate electrode is disposed.

With the above structure, the switching TFT of the element substrate can be shielded from the light by the gate wiring 145.

Also, a capacitor (also called a storage capacitor or auxiliary capacitor) of one pixel is formed of a second semiconductor layer 201 and a second electrode 114 with the insulating film that covers the second semiconductor layer 201 as a dielectric. The second semiconductor layer has a function of one electrode that constitutes the storage capacitor and also functions as the active layer of the current control TFT. Also, the second electrode 114 has a function of one electrode that constitutes the storage capacitor and is electrically connected to the drain region of the switching TFT by the connection electrode 143. In addition, a part of the second electrode 114 functions as the gate electrode of the current control TFT.

Further, the current control TFT is formed of a p-channel TFT, and a part of the second semiconductor layer is added with impurity elements that impart the p-type conductivity. Also, a part of the second semiconductor layer, which forms one electrode of the storage capacitor is added with the impurity elements that impart the p-type conductivity.

In this example, the storage capacitor is formed by using the second electrode, but is not limited to this structure. A pixel structure where a capacitor wiring or a capacitor electrode is disposed may be applied.

Also, the number of masks required for forming the element substrate having a pixel portion with the pixel structure shown in FIG. 1 and the driver circuit can be 6. That is, a first mask is used to pattern the first semiconductor layer 200 and the second semiconductor layer 201, and a second mask is used to pattern the first electrode 113, the second electrode 114, the source wiring 115 and the current supply line 116. A third mask is used to cover the n-channel TFT when the impurity elements that impart the p-type conductivity are added to the second semiconductor layer 201, and a fourth mask is used to form contact holes that reach the first semiconductor layer, the second semiconductor layer, the first electrode, the second electrode, the source wiring and the current supply line, respectively. A fifth mask is used to pattern the connection electrodes 140, 141, 143 and 144 and the gate wiring 145, and a sixth mask is used to pattern the pixel electrode 146.

As described above, in the case of the pixel structure shown in FIG. 1, the active matrix EL display device high in the pixel aperture ratio can be realized with a small number of masks.

The device thus structured according to the present invention will be described in more detail with the following embodiments.

Embodiment 1

An embodiment of the present invention will be described with reference to FIGS. 3A to 6B. A method of manufacturing a pixel portion and a TFT on a driver circuit portion disposed in the periphery of the pixel portion at the same time will be described. In this example, a pixel structure having two TFTs on one pixel is shown. For simplification of the description, a CMOS circuit, which is a basic circuit is shown as a driver circuit.

First, as shown in FIG. 3A, a base film 101 is formed to a thickness of 300 nm on a glass substrate 100. In this embodiment, a silicon nitride oxide film is laminated as the under film 101. At this point, it is preferable that the concentration of nitrogen of that film which is in contact with the glass substrate 100 is set to 10 to 25 wt %.

Also, apart of the under film 101 can be formed of an insulating film containing silicon (in particular, a silicon nitride oxide film or a silicon nitride film is preferable). The current control TFT is liable to be heated since a large current flows in the current control TFT, and it is effective that an insulating film having a heat radiation effect is disposed in the vicinity of the current control TFT.

Subsequently, an amorphous silicon film (not shown) is formed to a thickness of 50 nm on the under film 101 through a known film deposition method. The film does not need to be limited to the amorphous silicon film as long as it is a semiconductor film (including a microcrystalline semiconductor film) with the amorphous structure. In addition, a compound semiconductor film with the amorphous structure such as an amorphous silicon germanium film may be used. Also, the thickness of the film is set to 20 to 100 nm.

Then, the amorphous silicon film is crystallized through a known technique to form a crystalline silicon film (also called a polycrystalline silicon film or a polysilicon film) 102. As the known crystallizing method, there are a heat crystallizing method using a thermoelectric furnace, a laser-anneal crystallizing method using a laser beam and a lamp-anneal crystallizing method using infrared rays. In this embodiment, an excimer laser beam using XeCl gas is employed for crystallization.

In this embodiment, an excimer laser beam of the pulse oscillation type which is processed linearly is employed, but a rectangular laser beam may be employed, or an argon laser beam of the continuous oscillation type or an excimer laser beam of the continuous oscillation type can be employed.

In this embodiment, the crystalline silicon film is used as the active layer of the TFT, but the amorphous silicon film can be used as the active layer. Also, it is possible that the active layer of the switching TFT an off current of which needs to be reduced is formed of the amorphous silicon film, and the active layer of the current control TFT is formed of the crystalline silicon film. Because the amorphous silicon film is low in the carrier mobility, it is difficult to allow a current to flow in the amorphous silicon film and the off current to flow therein. In other words, both advantages of the amorphous silicon film in which the current is difficult to flow and the crystalline silicon film in which the current is easy to flow can be made useful.

Then, as shown in FIG. 3B, a protective film 103 formed of a silicon oxide film is formed in thickness of 130 nm on the crystalline silicon film 102. The thickness of the protective film 103 may be selected from a range of from 100 to 200 nm (preferably 130 to 170 nm). Also, the protective film 103 may be formed of another film if it is an insulating film containing silicon therein. The protective film 103 is provided for the purposes of preventing the crystalline silicon film from being directly exposed to plasma when the impurities are added and of enabling a fine concentration control.

Then, resist masks 104a and 104b are formed on the protective film 103, and impurity elements that impart the n-type conductivity (hereinafter referred to as an n-type impurity element) are added through the protective film 103. The n-type impurity elements may be representatively elements belonging to Group 15, typically phosphorus or arsenic. In this embodiment, phosphorus of $1 \times 10^{18}$ atoms/$cm^3$ is added by using the plasma doping method where plasma excitation is conducted without mass-separating phosphine ($PH_3$). It is needless to say that the ion injection method in which the mass separation is conducted may be employed.

The dose amount is adjusted in such a manner that the n-type impurity elements of $2 \times 10^{16}$ to $5 \times 10^{19}$ atoms/$cm^3$ (representatively $5 \times 10^{17}$ to $5 \times 10^{18}$ atoms/$cm^3$) in concentration are contained in an n-type impurity region 105 formed through the above process.

Subsequently, as shown in FIG. 3C, the protective film 103 and the resists 104a and 104b are removed to activate the added elements belonging to Group 15. a known technique may be used for the activating means, but in this embodiment, the elements are activated by irradiation of the excimer laser beam. The excimer layer may be of the pulse oscillation type or the continuous oscillation type, and the laser beam is not limited to the excimer laser beam. However, since the laser beam is used to activate the added impurity elements, it is preferable that the laser beam is irradiated onto the impurity elements with an energy by which the crystalline silicon film is not melted. Further, the laser beam may be irradiated onto the impurity elements while the protective film 103 remains as it is.

In the activation of the impurity elements by the laser beam, the activation by a heat treatment may be conducted together. In the case of conducting the heat treatment, the heat treatment may be conducted at about 450 to 550° C., taking the heat resistance of the substrate into consideration.

This process makes an end portion of the n-type impurity region 105, that is, a boundary portion (a joint portion) with a region where the n-type impurity elements are not added which exists in the periphery of the n-type impurity region 105 definite. This fact means that the LDD region and the channel-forming region can form a very excellent joint portion at a time when the TFT is completed.

Then, as shown in FIG. 3D, unnecessary portions of the crystalline silicon film are removed to form island-like semiconductor films (hereinafter referred to as active layers) 106 to 109.

Then, as shown in FIG. 3E, a gate insulating film 110 is so formed as to cover the active layers 106 to 109. The gate insulating film 110 may be formed of an insulating film containing silicon having a thickness of 10 to 200 nm, preferably 50 to 150 nm. The gate insulating film 110 may be of a single-layer structure or a laminate structure. In this embodiment, a 110 nm thick silicon nitride oxide film is used for the gate insulating film 110.

Then, a conductive film of 200 to 400 nm thickness is formed and then patterned to form gate electrodes 111 to 114, a source wiring 115 and a current supply line 116. The respective end portions of the gate electrodes 111 to 114, the source wiring 115 and the current supply line 116 can be tapered. In this embodiment, the gate electrodes 111 to 114 and lead wirings (hereinafter referred to as gate wirings) electrically connected to the gate electrodes 111 to 114 are formed on different insulating films.

Also, the gate electrodes may be formed of a single-layer conductive film but may be preferably formed of a laminate film such as a two-layer film or a three-layer film as occasion demands. The gate electrodes may be formed of any known conductive film. It is preferable that the gate electrodes are made of material which can be subjected to a fining process as described above, specifically which can be patterned in a line width of 2 μm or less.

Representatively, a film made of elements selected from the group consisting of tantalum (Ta), titanium (Ti), molybdenum (Mo), tungsten (W), chromium (Cr) and silicon (Si), a nitride film made of the above elements (representatively, a tantalum nitride film, a tungsten nitride film, and a titanium nitride film), an alloy film made of the combination of the above elements (representatively, a Mo—W alloy and a Mo—Ta alloy), or a silicide film made of the above elements (representatively, a tungsten silicide film and a titanium silicide film) may be employed. It is needless to say that those films may be of a single layer or a laminate layer.

In this embodiment, a laminate film consisting of a tungsten nitride (WN) film of 50 nm thickness and a tungsten (W) film of 350 nm thickness is used. This film may be formed by sputtering. Also, the addition of an inert gas such as Xe or Ne as a sputtering gas can prevent the films from being peeled off due to a stress.

Also, at this point, the gate electrode 112 is formed to overlap a part of the n-type impurity region 105 with the gate insulating film 110 interposed therebetween. The overlapped portion forms the LDD region which is superimposed on the gate electrode.

Then, as shown in FIG. 4A, n-type impurity elements (phosphorus in this embodiment) are added to the surface with the first electrode including the gate electrodes 111 to 114 as a mask in a self-aligning manner. Impurity regions 117 to 124 thus formed are adjustably added with phosphorus with the concentration of ½ to 1/10 (representatively ⅓ to ¼) of the n-type impurity region 105. Specifically, the concentration of phosphorus is preferably set to $1\times10^{16}$ to $5\times10^{18}$ atoms/cm$^3$ (typically $3\times10^{17}$ to $3\times10^{18}$ atoms/cm$^3$).

Then, as shown in FIG. 4B, resist masks 125a to 125d are so formed as to cover the gate electrodes and so on, and n-type impurity elements (phosphorus in this embodiment) are added to the surface to form impurity regions 126 to 130 containing phosphorus with a high concentration. Similarly, this process is conducted through the ion doping method using phosphorus (PH$_3$), and the concentration of phosphorus in that region is adjusted to $1\times10^{20}$ to $1\times10^{21}$ atoms/cm$^3$ (representatively $2\times10^{20}$ to $5\times10^{21}$ atms/cm$^3$).

Through the above process, the source region or the drain region of the n-channel TFT is formed. In the switching TFT, parts of the n-type impurity regions 120 to 122 formed in the process of FIG. 4A remain.

Then, as shown in FIG. 4C, the resist masks 125a to 125d are removed, and a resist mask 131 is newly formed. Thereafter, p-type impurity elements (boron in this embodiment) are added to the surface to form impurity regions 132 to 135 containing boron with a high concentration. In this example, boron is added to the surface through the ion doping method using diborane (B$_2$H$_2$) such that the concentration of boron becomes $3\times10^{20}$ to $3\times10^{21}$ atoms/cm$^3$ (representatively $5\times10^{20}$ to $1\times10^{21}$ atoms/cm$^3$).

Phosphorus has already been added to the impurity regions 132 to 135 with the concentration of $1\times10^{20}$ to $1\times10^{21}$ atoms/cm$^3$, and boron added in this process is added to the surface at least three times or more as much as phosphorus. For that reason, the n-type impurity region formed in advance is completely inverted to the p-type and functions as the p-type impurity region.

Subsequently, as shown in FIG. 4D, the resist mask 131 is removed.

Then, as shown in FIG. 5A, after a first interlayer insulating film 136 has been formed, the n-type or p-type impurity elements added with the different concentration, respectively are activated. The first interlayer insulating film 136 may be formed of a single layer of an insulating film containing silicon or a laminate film consisting of the combination of two or more kinds of insulating films containing silicon. Also, the thickness of the film may be set to 400 nm to 1.5 μm. In this embodiment, a silicon nitride oxide film of 200 nm thickness is formed as the first interlayer insulating film 136. The activation may be conducted through a furnace annealing method, a laser annealing method or a lamp annealing method. In this embodiment, a heat treatment is conducted in a thermoelectric furnace under a nitrogen atmosphere at 550° C. for 4 hours.

In this situation, the first interlayer insulating film functions as means for preventing oxidation of the gate electrodes.

In addition, a heat treatment is conducted under an atmosphere containing hydrogen of 3 to 100% at 300 to 450° C. for 1 to 12 hours to conduct a hydrogenation process. This process is a process of terminating dangling bond of the semiconductor film by hydrogen thermally excited. As another hydrogenation means, a plasma hydrogenation (using hydrogen excited by plasma) may be conducted.

In the case of using a laminate film as the first interlayer insulating film 136, the hydrogen process may be conducted between a process of forming one layer and a process of forming another layer.

Then, when the activation process has been completed, as shown in FIG. 5B, after a second interlayer insulating film 137 has been formed, contact holes are formed in the first interlayer insulating film 136, the second interlayer insulating film 137 and the gate insulating film 110 to pattern the respective wirings (including the connection electrodes) 138 to 145, and thereafter a pixel electrode 146 which is in contact with the connection electrode 141 is patterned. FIG. 1 shows a top view of a pixel portion on which the pixel electrode 146 has been formed, and a cross-sectional view taken along a dotted line A–A' or a dotted line B–B' in FIG. 1 corresponds to FIG. 5B.

The second interlayer insulating film 137 may be formed of a film made of organic resin, and the organic resin may be polyimide, polyamide, acrylic, BCB (benzocyclobutene) or the like. In particular, since a second interlayer insulating film 345 is meaningfully flattened, acrylic superior in flatness is preferable. In this embodiment, an acrylic film is formed with a thickness that enables a step formed by the TFT to be sufficiently flattened. Preferably, the thickness of the acrylic film may be set to 1 to 5 μm (more preferably, 2 to 4 μm).

The formation of the contact holes is made in such a manner that contact holes that reach the n-type impurity regions 126–130 or the p-type impurity regions 132 to 135, contact holes that reach the source wiring 115, contact holes that reach the current supply line 116 and contact holes that reach the gate electrode 113 (not shown) are formed by dry etching or wet etching, respectively.

Also, wirings (including the connection electrodes) 138 to 145 are obtained by patterning a laminate film of a three-layer structure resulting from continuously forming a Ti film of 100 nm thickness, an aluminum film containing Ti of 300 nm thickness and a Ti film of 150 nm thickness by sputtering into a desired configuration. It is needless to say that another conductive film may be employed as the wirings 138 to 145.

Also, reference numeral 138 denotes a source wiring connected to the p-type impurity region 132, 139 is a source wiring connected to the n-type impurity region 127 and 142 is a drain wiring connected to the p-type impurity region 133 and the n-type impurity region 126. Also, reference numeral 140 denotes a connection electrode that connects the source wiring 115 and the n-type impurity region 128. Also, reference numeral 144 denotes a connection electrode that connects the current supply line 116 and the p-type impurity region 135. Further, although not shown in FIGS. 5A to 5C, reference numeral 145 denotes a gate wiring which is connected to the gate electrode 113 through the contact hole. Still further, although not shown in FIGS. 5A to 5C, reference numeral 143 denotes a connection electrode that connects the n-type impurity region 130 and the gate electrode 114. Reference numeral 141 denotes a connection electrode that connects a pixel electrode formed in a subsequent process and the p-type impurity region 134.

Also, in this embodiment, an ITO film is formed to a thickness of 110 nm and then patterned as the pixel electrode 146. The pixel electrode 146 is superposed on the connection electrode 141 so as to be in contact with the latter to take contact. Also, a transparent conductive film obtained by mixing indium oxide with zinc oxide (ZnO) of 2 to 20% may be used. The pixel electrode 146 becomes an anode of the EL element.

Subsequently, an insulating film containing silicon (a silicon oxide film in this embodiment) is formed to a thickness of 500 nm, and an opening portion is defined at a position corresponding to the pixel electrode 146, to thereby form a third interlayer insulating film 147. In formation of the opening portion, a tapered side wall can be readily formed by using the wet etching method. If the side wall of the opening portion is not sufficiently gentle, the deterioration of the EL layer caused by the step leads to a remarkable problem.

Then, an EL layer 148 and a cathode (an MgAg electrode) 149 are continuously formed through the vacuum evaporation method without exposing to an atmosphere. The thickness of the EL layer 148 may be set to 80 to 200 nm (typically 100 to 120 nm), and the thickness of the cathode 149 may be set to 180 to 300 nm (typically 200 to 250 nm).

The EL layers and the cathodes are sequentially formed for a pixel corresponding to red, a pixel corresponding to green and a pixel corresponding to blue. Because the EL layer is poor in solution resistance, the pixels of the respective colors must be formed separately without using the photolithography technique. Therefore, it is preferable that pixels other than a desired pixel are covered with a metal mask, and the EL layer and the cathode are selectively formed on only necessary portions.

In other words, a mask that conceals all the portions except for the pixel corresponding to red is set, and the EL layer and the cathode for emitting red light are selectively formed by using the mask. Then, a mask that conceals all the portions except for the pixel corresponding to green is set, and the EL layer and the cathode for emitting green light are selectively formed by using the mask. Similarly, a mask that conceals all the portions except for the pixel corresponding to blue is set, and the EL layer and the cathode for emitting blue light are selectively formed by using the mask. Although different masks are used in this example, the same mask may be used. Also, it is preferable that processing is conducted with keeping a vacuum state until the EL layers and the cathodes are formed on all of the pixels.

In this example, there is used a system of forming three kinds of EL elements corresponding to RGB. However, there may be applied a method of combining an EL element of emitting white light with color filters, a system of combining an EL element of emitting blue or bluish green light with a fluorescent substance (fluorescent color conversion layer: CCM), a system in which EL elements corresponding to RGB are superimposed on a cathode (a counter electrode) by using a transparent electrode, and so on.

The EL layer 148 maybe made of known material. It is preferable that the known material is organic material, taking a drive voltage into consideration. For example, the EL layer may be formed by a four-layer structure consisting of a hole injection layer, a hole transport layer, a light emitting layer and an electron injection layer. Also, in this embodiment, there is shown the example in which the MgAg electrode is used as the cathode of the EL elements. However, the cathode of the EL elements may be made of other known material.

Then, a protective film 150 is so formed as to cover the EL layers and the cathodes. The protective electrode 150 may be formed of a conductive film mainly containing aluminum. The protective electrode 150 may be formed through the vacuum evaporation method by using a mask different from that used when the EL layer and the cathode are formed. Also, it is preferable that the protective electrode 150 is continuously formed without exposing to an atmosphere after the EL layers and the cathodes are formed.

Finally, a passivation film 151 formed of a silicon nitride film is formed to a thickness of 300 nm. In fact, the protective electrode 150 functions as means for protecting the EL layer from moisture, and if the passivation film 151 is formed, the reliability of the EL element can be further enhanced.

Thus, the active matrix EL display device of the structure shown in FIG. 5C is completed. Incidentally, the active matrix EL display device according to this embodiment can exhibit a very high reliability and improve the operating characteristic by disposing the TFTs of an optimum structure on not only the pixel portion but also the driver circuit portion.

First, a TFT having a structure by which a hot carrier injection is reduced so as not to decrease the operating speed as much as possible is used as an n-channel TFT 205 of the CMOS circuit that forms the driver circuit. In this example, the driver circuit includes a shift register, a buffer, a level shifter, a sampling circuit (sample and hold circuit) and the like. In the case of conducting digital drive, the driver circuit may include a signal converter circuit such as a D/A converter.

In case of this embodiment, as shown in FIG. 5C, the active layer of the n-channel TFT 205 includes a source region 152, a drain region 153, an LDD region 154 and a channel-forming region 155, and the LDD region 154 is superimposed on the gate electrode 112 with the gate insulating film 110 interposed therebetween.

The reason for that the LDD region is formed on only the drain region side is because the operating speed is prevented from decreasing. Also, it is better that the n-channel TFT 205 does not require the off current value much but regards the operating speed as importance. Therefore, it is desirable that the LDD region 154 is completely superimposed on the gate electrode, and the resistant component is reduced as much as possible. That is, it is better to eliminate so-called offset.

Also, since a p-channel TFT 206 of the CMOS circuit is hardly deteriorated by hot carrier injection, the LDD region may not be particularly disposed. It is possible that the LDD region is disposed as in the n-channel TFT 205 for counter measure against hot carriers.

In the driver circuit, the sampling circuit is relatively special as compared with other circuits because a large current flows in the channel-forming region in two directions. That is, the actions of the source region and the drain region are replaced by each other. In addition, it is necessary to suppress the off current value as much as possible, and from this viewpoint, it is desirable that the TFT having an intermediate function between the switching TFT and the current control TFT is disposed.

In fact, after the device shown in FIG. 5C is completed, it is preferable that the device is packaged (sealed) with a protective film (a laminate film, an ultraviolet setting resin film and the like) high in air tightness or a housing material such as a ceramic sealing can so as not to be exposed to the exterior. In this situation, if the interior of the housing material is made in an inert atmosphere or a hygroscopic material (for example, barium oxide) is disposed within the housing material, the reliability (lifetime) of the EL layer is improved.

Also, if the air tightness is enhanced by a process such as packaging, a connector (flexible printed circuit: FPC) for connecting a terminal drawn from the elements or the circuits formed on the substrate and an external signal terminal is fitted to the device, thus completing the device as a product. The EL display device which, is in a state where it can be shipped is called an EL module in this specification.

Figure 6A:
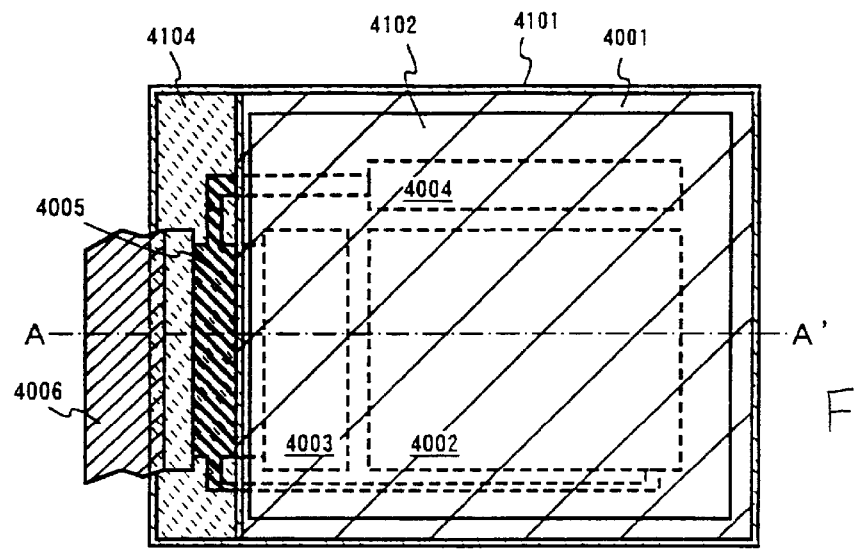
FIGS. 6A and 6B are an appearance top view and a cross-sectional view showing an active matrix EL display device in accordance with Embodiment 1 of the present invention.
Figure 6B:
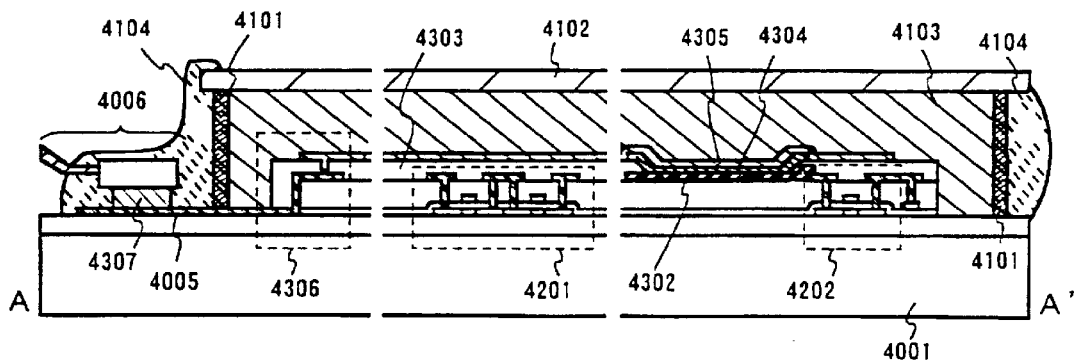

FIG. 6A is a top view of the EL module (EL display device) obtained by the above manufacturing method, and FIG. 6B is a cross-sectional view of the EL module.

In FIG. 6A, reference numeral 4001 denotes a substrate, 4002 is a pixel portion, 4003 is a source side driver circuit, and 4004 is a gate side driver circuit, and the respective driver circuits reach an FPC (flexible printed circuit) 4006 through a wiring 4005 and are then connected to an external device.

In this case, a first sealing material 4101, a cover material 4102, a filler 4103 and a second sealing material 4104 are so disposed as to surround the pixel portion 4002, the source side driver circuit 4003 and the gate side driver circuit 4004.

Also, FIG. 6B corresponds to a cross-sectional view taken along a line A–A' in FIG. 6A and shows a driving TFT (an n-channel TFT and a p-channel TFT in this example) 4201 contained in the source side driver circuit 4003 on the substrate 4001. Further, a current control TFT (a TFT that controls a current to the EL element) 4202 contained in the pixel portion 4002 is formed.

In this embodiment, a TFT of the same structure as that of the p-channel TFT or the n-channel TFT shown in FIG. 5C is used for the driving TFT 4201, and a TFT of the same structure as that of the p-channel TFT shown in FIG. 5C is used for the current control TFT 4202. Also, a storage capacitor (not shown) connected to the gate of the current control TFT 4202 is disposed on the pixel portion 4002.

A pixel electrode (anode) 4302 which is electrically connected to the drain of the pixel TFT 4202 is so formed as to be superimposed on the drain wiring of the current control TFT 4202. A transparent conductive film large in work function is employed as the pixel electrode 4302. The transparent conductive film may be made of a compound consisting of indium oxide and tin oxide, a compound consisting of indium oxide and zinc oxide, zinc oxide, tin oxide or indium oxide. Also, gallium may be added to the transparent conductive film.

Then, an insulating film 4303 is formed on the pixel electrode 4302, and opening portions are formed on the pixel electrode 4302 in the insulating film 4303. In the opening portion, an EL (electro-luminescent) layer 4304 is formed on the pixel electrode 4302, and the EL layer 4304 may be made of known organic EL material or inorganic EL material. Also, the organic EL material may be a low molecular weight (monomer) material or a high molecular weight (polymer) material.

A method of forming the EL layer 4304 may be conducted by using a known evaporation technique or a coating technique. Also, the structure of the EL layer may be of a laminate structure resulting from freely combining a hole injection layer, a hole transport layer, a light emitting layer, an electron transport layer and an electron injection layer together, or a single-layer structure.

A cathode 4305 formed of a conductive film (representatively, a conductive film mainly containing aluminum, copper or silver, or a laminate layer consisting of those films and other conductive films) having a light shielding property is formed on the EL layer 4304. Also, it is desirable that moisture or oxygen existing on an interface of the cathode 4305 and the EL layer 4304 is removed as much as possible. Therefore, it is necessary that the EL layer 4304 and the cathode 4305 are successively deposited in vacuum or that the cathode 4305 is formed while the cathode 4305 is out of contact with oxygen or moisture after forming the EL layer 4304 in a nitrogen or rare gas atmosphere. In this embodiment, the above film can be formed by using the film forming device of the multi-chamber system (cluster tool system).

Then, the cathode 4305 is electrically connected to the wiring 4005 in a region designated by reference numeral 4306. The wiring 4005 is a wiring for supplying a given voltage to the cathode 4305 and electrically connected to the FPC 4006 through an anisotropic conductive film 4307.

As described above, an EL element consisting of the pixel electrode (anode) 4302, the EL layer 4304 and the cathode 4305 is formed. The EL element is surrounded by the first sealing material 4101 and the cover material 4102 bonded on the substrate 4001 by the first sealing material 4101, and is then sealed with the filler 4103.

The cover material 4102 may be made of glass material, metal material (representatively, stainless steel), ceramic material, or plastic material (including a plastic film). The plastic material maybe an FRP (fiberglass reinforced plastics) plate, a PVF (polyvinyl fluoride) film, a Mylar film, a polyester film or an acrylic film. Further, a sheet of the structure in which aluminum foil is sandwiched between a PVF film or a Mylar film.

In the case where the light radiation direction from the EL element is directed toward the cover material side, the cover material must be transparent. In this case, the cover material is a transparent material such as a glass plate, a plastic plate, a polyester film or an acrylic film.

Also, the filler 4103 may be made of an ultraviolet setting resin or a thermosetting resin such as PVC (polyvinyl chloride), acrylic, polyimide, epoxy resin, silicon resin, PVB (polyvinyl butyral) or EVA (ethylene vinyl acetate). If a hygroscopic material (preferably barium oxide) or a material that can absorb oxygen (antioxidant and the like) is disposed within the filler 4103, the deterioration of the EL element can be suppressed.

Further, spacers may be contained in the filler 4103. In this case, if the spacers are made of barium oxide, the spacer per se can provide hygroscopic property. In addition, in the case where the spacers are disposed in the filler, it is effective that a resin film is disposed on the cathode 4305 as a buffer layer that relaxes a pressure from the spacers.

Also, the wiring 4005 is electrically connected to the FPC 4006 through the anisotropic conductive film 4307. The wiring 4005 transmits a signal sent to the pixel portion 4002, the source side driver circuit 4003 and the gate side driver circuit 4004 to the FPC 4006, and is then electrically connected to an external device by the FPC 4006.

Further, in this embodiment, the second sealing material 4104 is so disposed as to cover an exposed portion of the first sealing material 4101 and a part of the FPC 4006, and the EL element is thoroughly shielded from the open air. Thus, there is obtained an EL display device having an outer appearance shown in FIG. 6A and having cross-sectional views shown in FIGS. 6B and 5C.

Embodiment 2

Laser crystallization is used as the means of forming the crystalline silicon film 102 in embodiment 1, and a case of using a different means of crystallization is explained in embodiment 2.

After forming an amorphous silicon film in embodiment 2, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application No. Hei 11-076967 by the applicant of the present invention.

The processes of manufacturing shown in embodiment 1 are one embodiment of the present invention, and provided that the structure of FIG. 1 or of FIG. 5C of embodiment 1 can be realized, then other manufacturing process may also be used without any problems, as above.

Embodiment 3

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current control TFT. The current flowing in an EL element is then controlled by the current control TFT, the EL element emitting intensity is controlled, and gray scale display is performed.

On the other hand, when digital driving is performed, it differs from the analog type gray scale display, and gray scale display is performed by time division driving. Specifically, the emitting time is adjusted to provide visual appearance that seems like changes in color gradation.

The EL element has an extremely fast response speed in comparison to a liquid crystal element, and therefore it is possible to have high speed driving. Therefore, the EL element is one, which is suitable for time ratio gray scale driving, in which one frame is partitioned into a plural number of subframes and then gray scale display is performed.

The present invention is a technique related to the element structure, and therefore any method of driving it may thus be used. Note that it is possible to freely combine the constitution of embodiment 3 with the constitution of any of embodiments 1 or 2.

Embodiment 4

Figure 7A:
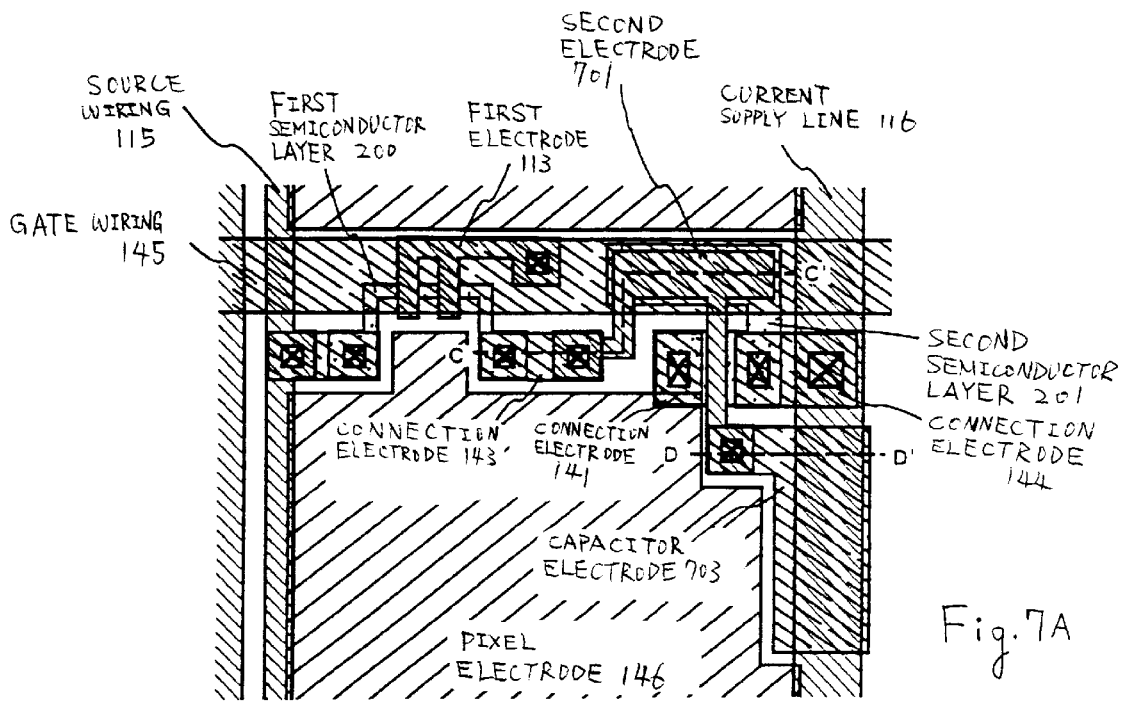
FIGS. 7A to 7C are top views showing a pixel portion in accordance with Embodiment 4 of the present invention.
Figure 7B:
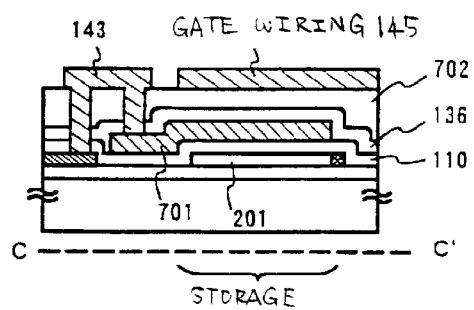
Figure 7C:
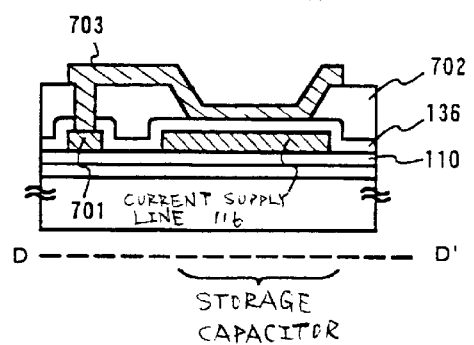

In this embodiment, a top view of a pixel structure different from that in Embodiment 1 is shown in FIG. 7A. In this embodiment, only the structure of the storage capacitor is different and other structures are substantially identical with those in Embodiment 1. Also, FIG. 7B is a cross-sectional view taken along a dotted line C–C' in FIG. 7A, and FIG. 7C shows a cross-sectional view taken along a dotted line D–D' in FIG. 7A. Parts designated by the same references correspond to those in Embodiment 1.

First, a state of FIG. 5A is obtained in accordance with Embodiment 1. However, the configuration of the second electrode is slightly different from that in Embodiment 1, and the second electrode has a portion connected to a capacitor electrode which will be formed in a later process. Then, an interlayer insulating film made of organic resin is formed and then etched to form contact holes. In this embodiment, two contact holes that reach the second electrode are formed. Also, in this embodiment, the interlayer insulating film made of organic resin is first selectively removed to remove a portion where the contact hole portions and the current supply line are superimposed on each other. Then, one mask is added, and after the interlayer insulating film 136 of the portion which is superimposed on the current supply line is covered with the mask, etching is conducted to form the contact holes. In this way, there is obtained an interlayer insulating film 702 from which the portion superimposed on the current supply line and the contact hole portions are removed.

Then, the gate wiring 145, the connection electrodes 141, 143 and 144, and a capacitor electrode 703 are formed. The capacitor electrode 703 is electrically connected to a second electrode 701. In this way, as shown in FIG. 7C, a storage capacitor is formed by the capacitor electrode 703 and the current supply line 116 with the first insulating film 136 as a dielectric.

With the above structure, the storage capacitor can be further increased.

As shown in FIG. 7B, the storage capacitor is formed by the second semiconductor layer 201 and the second electrode 701 with the insulating film 110 as a dielectric as in Embodiment 1.

This embodiment can be arbitrarily combined with any one of Embodiments 1 to 3.

Embodiment 5

In embodiment 1, it was said that, preferably, an organic EL material is used as an EL layer. However, the present invention can also be performed by using an inorganic EL material. In this case, since the inorganic EL material of the present time is of a very high driving voltage, TFTs to be used must have resisting-pressure characteristics resistible to such a driving voltage.

If an inorganic EL material of an even lower driving voltage is developed in the future, it will be applicable to the present invention.

The structure of this embodiment can be freely combined with any one of the structures of embodiments 1–3.

Embodiment 6

In the present invention, an organic material used as an EL layer may be either a low molecular organic material or a polymer (high molecular) organic material. As the low molecular organic material, materials are known centering on Alq$_3$ (tris-8-quinolylite-aluminum), TPD (triphenylamine derivative) or the like. As polymer organic material, π-cooperative polymer materials can be given. Typically, PPV (polyphenylenevynilene), PVK (polyvynilcarbazole), polycarbonate or the like can be given.

The polymer (high molecular) organic material can be formed with a simple thin film formation method such as the spin coating method (which is referred to also as solution application method), the dipping method, the dispense method, the printing method, the ink jet method or the like. The polymer organic material has a high heat endurance compared with the low molecular organic material.

Furthermore, in the case where the EL layer incorporated in the EL element incorporated in the EL display according to the present invention has an electron transport layer and a positive hole transport layer, the electron transport layer and the positive hole transport layer may be formed of inorganic material such as, for example, a non-crystal semiconductor formed of non-crystal Si or non-crystal $Si_{1-x}C_x$ or the like.

In the non-crystal semiconductor, a large quantity of trap level is present, and at the same time, the non-crystal semiconductor forms a large quantity of interface levels at an interface at which the non-crystal semiconductor contacts other layers. As a consequence, the EL element can emit light at a low voltage, and at the same time, an attempt can be made to provide a high luminance.

Besides, a dopant (impurity) is added to the organic EL layer, and the color of light emission of the organic EL layer may be changed. These dopant includes DCM1, nile red, lubren, coumarin 6, TPB and quinaquelidon.

Embodiment 7

This embodiment shows a pixel structure having three TFTs in one pixel.

Figure 8:
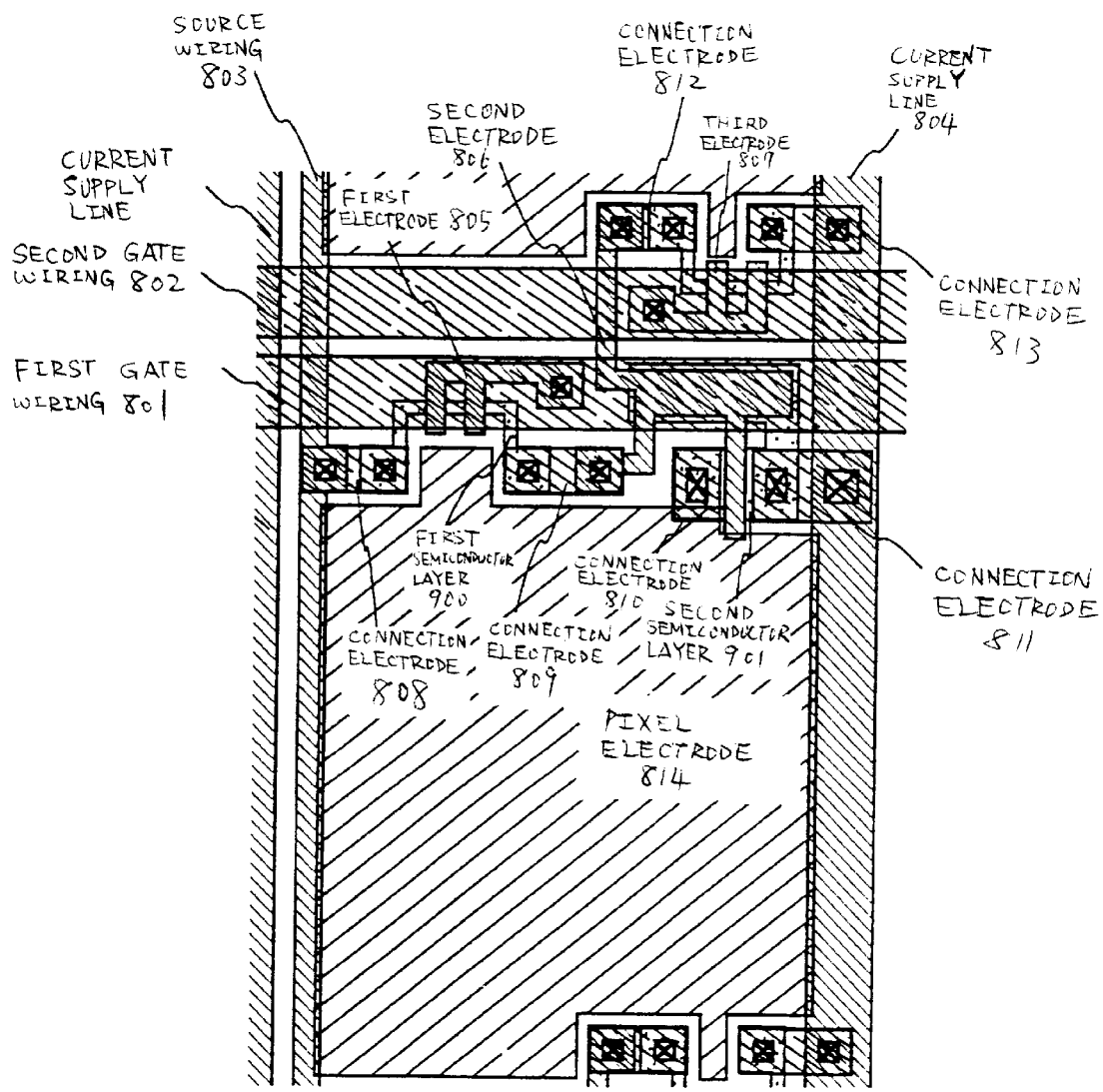
FIG. 8 is a top view showing a pixel portion in accordance with Embodiment 7 of the present invention.

One specific example of the pixel structure according to the present invention is shown in FIG. 8. Also, an equivalent circuit of the pixel structure shown in FIG. 8 is shown in FIG. 9.

Figure 9:
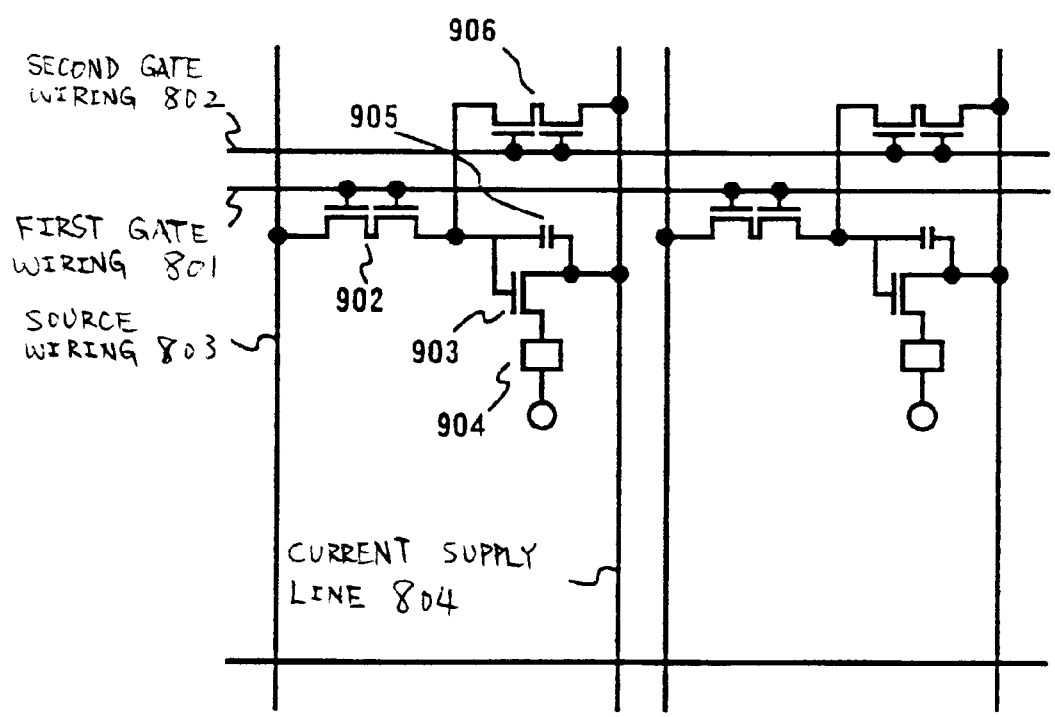
FIG. 9 is a diagram showing an equivalent circuit in the pixel portion in accordance with Embodiment 7 of the present invention.

As shown in FIGS. 8 and 9, the pixel portion has a first gate wiring 801 arranged in a row direction, a second gate wiring 802, a source wiring 803 arranged in a column direction, and a current supply line 804. Also, the pixel portion includes a switching TFT 902 connected to the source wiring 803 by a connection electrode 808 with a part of a first electrode 805 connected to the first gate wiring 801 as a gate electrode. Also, the pixel portion has a current control TFT 903 connected to a light-emitting element 904 by a connection electrode 810 and connected to the current supply line 804 by a connection electrode 811. Further, the pixel portion has an erasing TFT 906 connected to the current supply line 804 by the connection electrode 813 with a part of the third electrode 807 connected to the second gate wiring 802 as a gate electrode.

Further, the respective TFTs are connected to each other, the erasing TFT 906 is connected to the gate electrode of the current control TFT by a connection electrode 812, and the current control TFT 903 is connected to the drain region of the switching TFT by a connection electrode 809.

In this specification, the first gate wiring 801 is connected to the island-like first electrode 805 disposed in the row direction. Also, the first gate wiring 801 is formed on the second insulating film so as to be in contact with the latter. On the other hand, the second gate wiring 802 is connected to the island-like third electrode 807 disposed in the row direction. Also, the island-like first electrode 805, a second electrode 806 and the third electrode 807 are formed on the first insulating film so as to be in contact with the latter as in the source wiring 803 and the current supply line 804.

Also, the connection electrodes 808 to 813 are formed on the second insulating film (hereinafter referred to also as an interlayer insulating film) as in the first gate wiring 801 and the second gate wiring 802.

Further, the pixel portion includes a storage capacitor 905 with a second semiconductor layer 901 as one electrode, the insulating film that covers the second semiconductor layer so as to be in contact with the latter as a dielectric, and the second electrode 806 as another electrode.

Further, a pixel electrode 814 is superimposed on the connection electrode 810 connected to the current control TFT 903 so as to be in contact with the connection electrode 810. Also, an end portion of the pixel electrode 814 is superimposed on the source wiring 803. In fact, an EL layer, a cathode, a protective electrode and so on are formed with the pixel electrode 814 as an anode, thus completing an active matrix EL display device.

As to the operation of the erasing TFT, refer to Japanese Patent Application No. Hei 11-338786.

The drain of the erasing TFT is connected to the gate of the current control TFT so that the gate voltage of the current control TFT can be forcedly changed. The erasing TFT may be an n-channel TFT or a p-channel TFT, but it is preferable that the erasing TFT is of the same structure as the switching TFT such that an off current can be reduced.

Also, in this embodiment, the switching TFT and the erasing TFT are of the multi-gate structure. However, they are not particularly limited to this, and at least one of the switching TFT, the current control TFT and the erasing TFT may be of the multi-gate structure. If the erasing TFT is of the multi-gate structure, the deterioration of the erasing TFT due to heat can be suppressed.

This embodiment provides the structure in which three TFTs are disposed in one pixel, however, the EL display device according to the present invention may be of the structure in which any number of TFTs are disposed within one pixel. For example, 4 to 6 or more TFTs may be disposed. The present invention can be implemented without the limit of the pixel structure of the EL display device.

Embodiment 8

This embodiment shows an example in which insulators superimposed on an end portion of the pixel electrode so as to be in contact with the latter are superimposed on the current supply line or the source wiring in a stripe.

FIG. 10 shows a top view of only an electrode in Embodiment 7. The semiconductor layer and the contact holes are omitted for simplification although they exist in fact. Also, parts designated by the same references are the same parts. In FIG. 10, an insulator is formed on a portion sandwiched by a chain line and superimposed on the current supply line 804.

First, after a state of FIG. 8 shown in Embodiment 7 is obtained, an organic insulating film is formed and then etched in a desired configuration. Insulators 1000 and 1001 formed of organic resin films are formed in a stripe so as to cover an end portion of the pixel electrode 814. Then, an EL layer 1002 is formed between the insulators 1000 and 1001 formed of the organic resin films. Thereafter, a cathode 1003 is formed all over the surface, and a protective electrode 1004 and a protective insulating film 1005 are formed thereon. Those insulators 1000 and 1001 function as means for preventing short-circuiting occurring between the adjacent pixel electrodes. Also, those insulators 1000 and 1001 function as means for preventing short-circuiting between the pixel electrode 814 which is an anode and the cathode 1003.

This embodiment shows an example in which the insulators are disposed in a stripe, but they are not particularly limited and may be of a structure in which an insulator that covers portions other than the opening portion of the pixel electrode is disposed.

Embodiment 9

In this embodiment, in an active matrix EL display device, in order to suppress the luminance nonuniformity of a produced image, a method of determining ranges of a threshold voltage variation ΔVth and a ratio W/L of a channel width W and a channel length L is shown below.

This shows an example in which a difference in luminescent luminance between the respective pixels is suppressed within ±n%.

First, Expression 2 is derived from Expression 1.

$$Id = \frac{1}{2} \times \mu \times C_o \times \frac{W}{L} \times (V_{gs} - V_{th})^2 \quad \text{Exp. 1}$$

$$\frac{W}{L} \times (V_{gs} - V_{th})^2 = \frac{2 \times Id}{\mu \times C_o} \quad \text{Exp. 2}$$

The mobility $\mu$ and the capacitance $C_o$ of a gate capacitor are fixed at a time when the TFT is formed. Also, when the EL element is going to be made luminescent with a desired luminescent luminance, since the luminescent luminance of the EL element and the current density have a linear relationship, a value of the drain current Id is also fixed. Therefore, the right side of Expression 2 is replaced by a constant A into Expression 3.

$$\frac{W}{L} \times (V_{gs} - V_{th})^2 = A \quad \text{Exp. 3}$$

Also, in the case where a difference in luminescent luminance between the respective pixels is suppressed within ±n%, the relational expression of the threshold voltage variation ΔVth and the ratio W/L of the channel width W and the channel length L is represented by the following Expression 4 and Expression 5.

$$\frac{A}{(V_{gs(max)} - V_{th})^2} \leq \frac{W}{L} \leq \frac{A}{\{(100 + 10\sqrt{100 + n})\Delta V_{th/n}\}^2} \quad \text{Exp. 4}$$

$$\frac{-(100 + 10\sqrt{100 + n})}{n} \sqrt{\frac{A}{\left(\frac{W}{L}\right)}} \leq \quad \text{Exp. 5}$$

$$\Delta V_{th} \leq \frac{(100 + 10\sqrt{100 + n})}{n} \sqrt{\frac{A}{\left(\frac{W}{L}\right)}}$$

If values of ΔVth and W/L are determined within the limit that satisfies the above Expression 4 and Expression 5, the variation of the drain current Id can be suppressed within ±n%.

For example, in the case where the variation ΔVth of the threshold voltage is fixed by the manufacturing process of the TFT, the range of the ratio W/L of the channel width W and the channel length L is determined by Expression 4 and Expression 5 based on the threshold voltage variation ΔVth.

Further, in the case where the ratio W/L of the channel width W and the channel length L is fixed by the design, the variation ΔVth of the threshold voltage is determined by Expression 4 and Expression 5 based on the ratio W/L of the channel width W and the channel length L.

With the above structure, the EL display according to the present invention can suppress the luminance nonuniformity caused by the variation of the threshold voltage of the current control TFT of each pixel. In fact, it is desirable that the difference of the luminescent luminance between the respective pixels is set within ±5%, preferably within ±3%.

Also, the structure of this embodiment can be arbitrarily combined with any structure of Embodiments 1 to 6.

Embodiment 10

This embodiment shows an example of a film forming device used in formation of an EL layer in the above respective embodiments.

Figure 11:
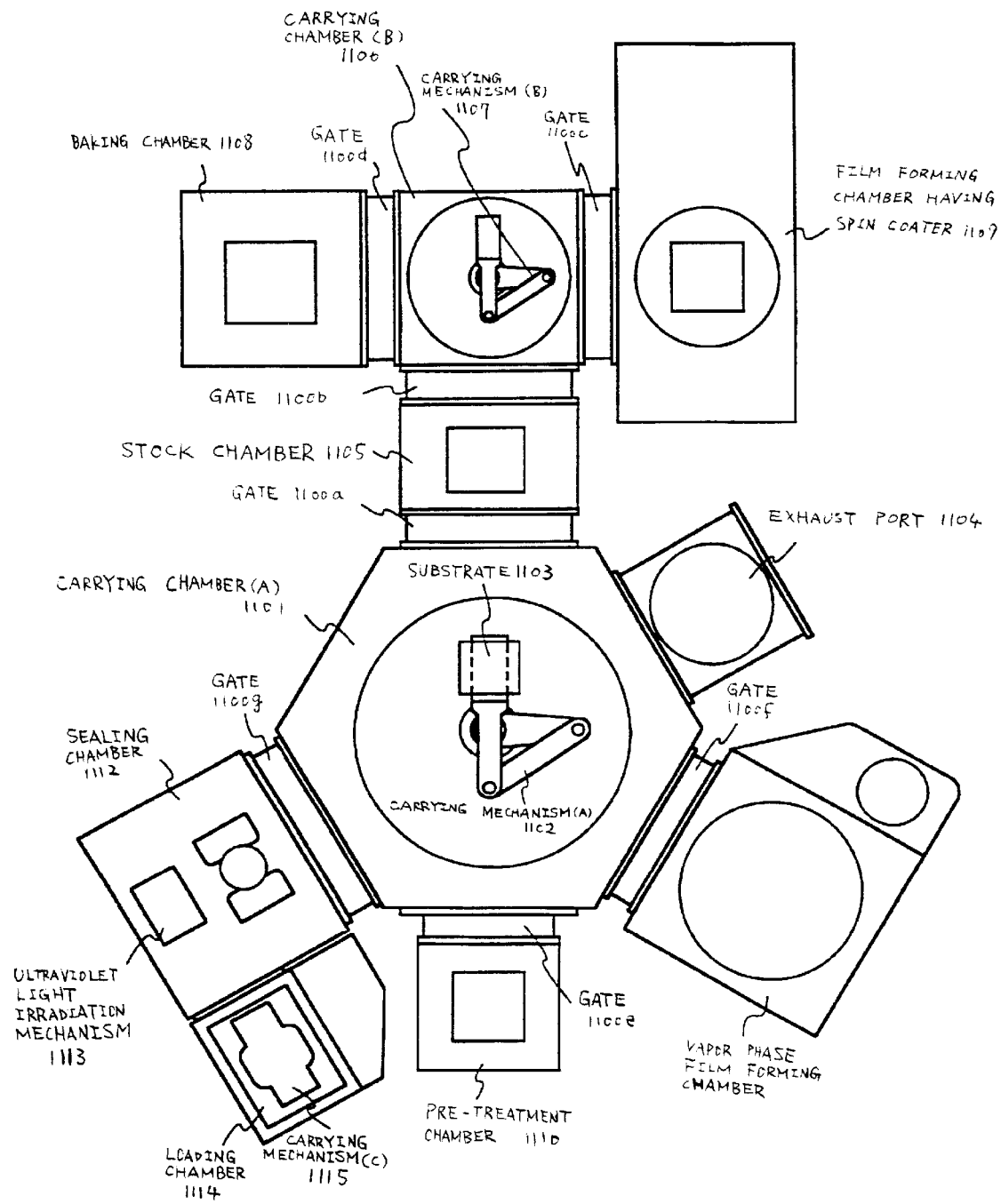
FIG. 11 is a diagram showing a manufacturing device in accordance with Embodiment 10 of the present invention.

The film forming device according to this embodiment will be described with reference to FIG. 11. Referring to FIG. 11, reference numeral 1101 denotes a carrying chamber (A), and a carrying mechanism (A) 1102 is disposed within the carrying chamber (A) 1101 where a substrate 1103 is carried. The carrying chamber (A) 1101 is in a reduced pressure atmosphere and is isolated from the respective processing chambers by gates. The delivery of the substrates to the respective processing chambers is conducted by the carrying mechanism (A) when the gates are opened. Also, in order to reduce a pressure within the carrying chamber (A) 1101, an exhaust pump such as a hydraulic rotary pump, a mechanical booster pump, a turbo molecular pump or a cryopump can be employed, and the cryopump is preferable because it is effective in removal of moisture.

In the film forming device of FIG. 11, an exhaust port 1104 is disposed on a side surface of the carrying chamber (A) 1101, and the exhaust pump is located under that exhaust port 1104. This structure is advantageous in that the maintenance of the exhaust pump is facilitated.

Hereinafter, the respective processing chambers will be described. Since the carrying chamber (A) 1101 is in the reduced pressure atmosphere, exhaust pumps (not shown) are provided in all of the processing chambers which are directly connected to the carrying chamber (A) 1101. The exhaust pump may be a hydraulic rotary pump, a mechanical booster pump, a turbo molecular pump or a cryopump.

First, reference numeral 1105 denotes a stock chamber that conducts the setting (location) of the substrate, which is also called a load lock chamber. The stock chamber 1105 is isolated from the carrying chamber (A) 1101 by a gate 1100a where a carrier on which the substrate 1103 is set (not shown) is located. The stock chamber 1105 may be divided into two sections for taking in the substrate and taking out the substrate. Also, the stock chamber 1105 includes the above-mentioned exhaust pump and a purge line for introducing nitrogen gas or rare gas high in purity.

Also, in this embodiment, the substrate 1103 is set on the carrier in a state where a surface of the substrate 1103 on which the elements are formed is directed downward. This is because a face-down system (also called depo-up system) is liable to be conducted when a vapor-phase deposition (a film deposition through the sputtering or evaporation) is conducted. The face-down system is a system in which the film is formed in a state where the surface of the substrate on which the elements are to be formed is directed downward, by which dusts can be suppressed from being stuck onto the substrate.

Then, reference numeral 1106 denotes a carrying chamber (B) which is coupled with the stock chamber 1105 through a gate 1100b and has a carrying mechanism (B) 1107. Also, reference numeral 1108 denotes a baking chamber which is coupled with the carrying chamber (B) 1106 through a gate 1100c. The baking chamber 1108 has a mechanism that inverts the surface of the substrate. That is, the substrate carried through the face-down system is switched to the face-up system once. This is because a subsequent process using a spin coater 1109 is conducted through the face-up system. Conversely, the substrate which has been processed by the spin coater 1109 is returned to the baking chamber 1108 again and then baked. Then, the substrate is turned upside down, and the face-up system is switched to the face-down system. Thereafter, the substrate is returned to the stock chamber 1105.

Incidentally, the film forming chamber 1109 having the spin coater is coupled with the carrying chamber (B) 1106 through a gate 1100d. The film forming chamber 1109 having the spin coater is a film forming chamber that forms a film containing an EL material by coating a solution containing the EL material on the substrate. In this embodiment, a film is formed from a high molecular weight (polymer) organic EL material in the film forming chamber 1109 having the spin coater. The EL material to be formed into the film is used for not only a light emitting layer but also a charge injection layer or a charge transport layer. Also, any known high molecular weight organic EL material may be used.

A representative organic EL material that forms the light emitting layer may be PPV (polyparaphenylene vinylene) dielectric, PVK (polyvinyl carbazole) dielectric or polyfluorene dielectric. This is also called π conjugate polymer. Also, an organic EL material for the charge injection layer may be PEDOT (polythiophene) or Pani (polyaniline).

This embodiment shows the film forming chamber using the spin coater. However, the present invention is not limited to the spin coater and the film forming chamber using a dispenser, print or ink jet instead of the spin coater may be used.

Further, the film forming device according to this embodiment can be used when forming the EL layer in the structure where any structure of Embodiments 1 to 9 are arbitrarily combined with the structure of this embodiment.

Embodiment 11

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electronic devices. For example, in order to view a TV program or the like on a large-sized screen, the self-emission device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric devices.

Such electronic devices include a video camera, a digital camera, a goggles-type display (head mount display), a car navigation system, a sound reproduction device (an audio equipment etc.), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a compact disc (CD), a laser disc (LD), a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 12A to 13B respectively show various specific examples of such electronic devices.

Figure 12A:
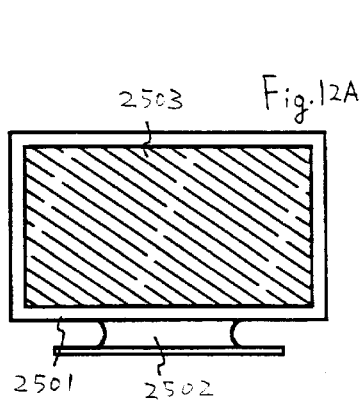
FIGS. 12A to 12F are diagrams showing examples of electronic equipment in accordance with Embodiment 11 of the present invention.

FIG. 12A illustrates an EL display which includes a frame 2001, a support table 2002, a display portion 2003, or the like. The present invention is applicable to the display portion 2003. The EL display is of the EL display type and therefore requires no back light. Thus, the display portion thereof can have a thickness thinner than that of the liquid crystal display device.

Figure 12B:
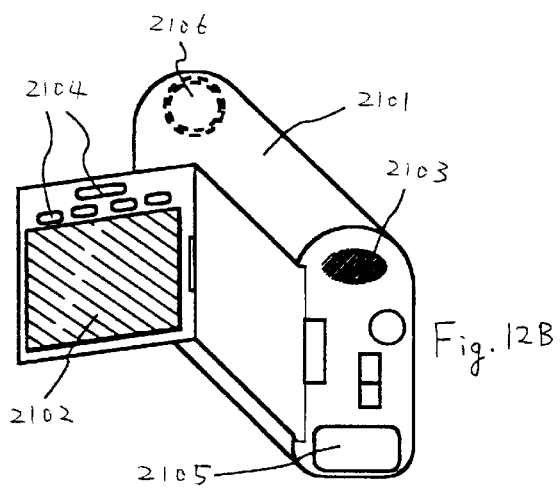

FIG. 12B illustrates a video camera which includes a main body 2101, a display portion 2102, an audio input portion 2103, operation switches 2104, a battery 2105, an image receiving portion 2106, or the like. The self-emission device in accordance with the present invention can be used as the EL display portion 2102.

Figure 12C:
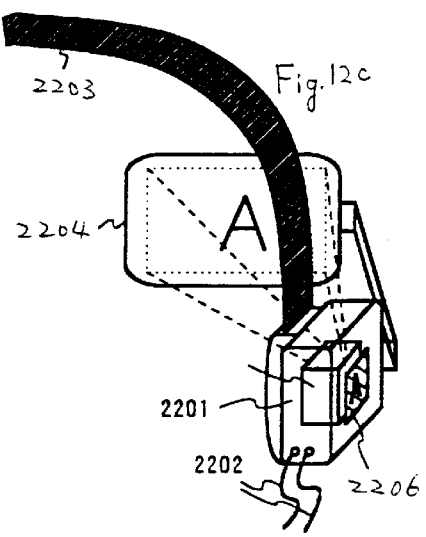

FIG. 12C illustrates a portion (the right-half piece) of an EL display of head mount type, which includes a main body 2201, signal cables 2202, a head mount band 2203, a display portion 2204, an optical system 2205, an self-emission device 2206, or the like. The present invention is applicable to the EL display device 2206.

Figure 12D:
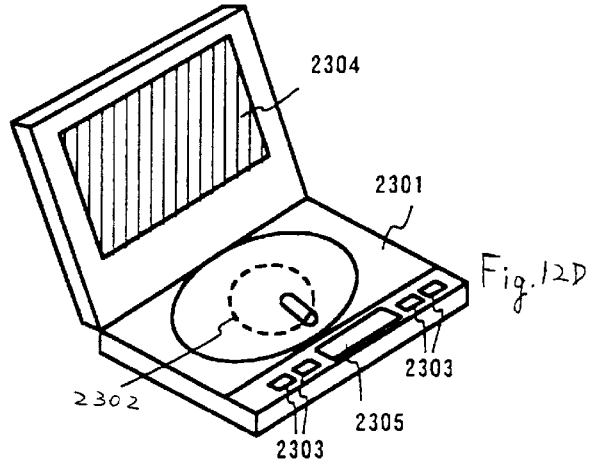

FIG. 12D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction devise and a game machine or the like.

Figure 12E:
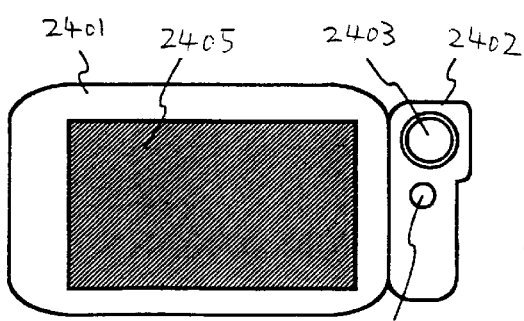

FIG. 12E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 12F:
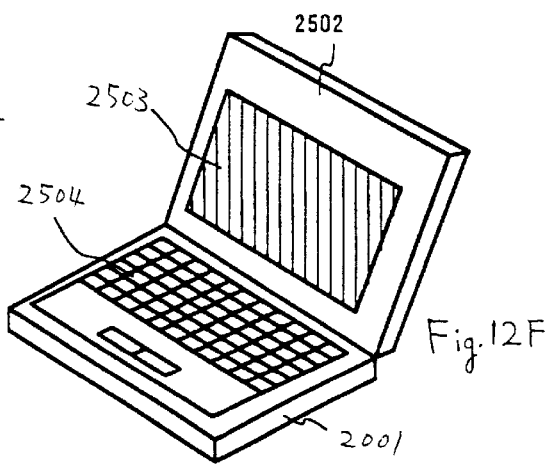

FIG. 12F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a car audio equipment, it is desirable to drive the EL display device so that the character information is formed by a light-emitting portion while a non-emission portion corresponds to the background.

Figure 13A:
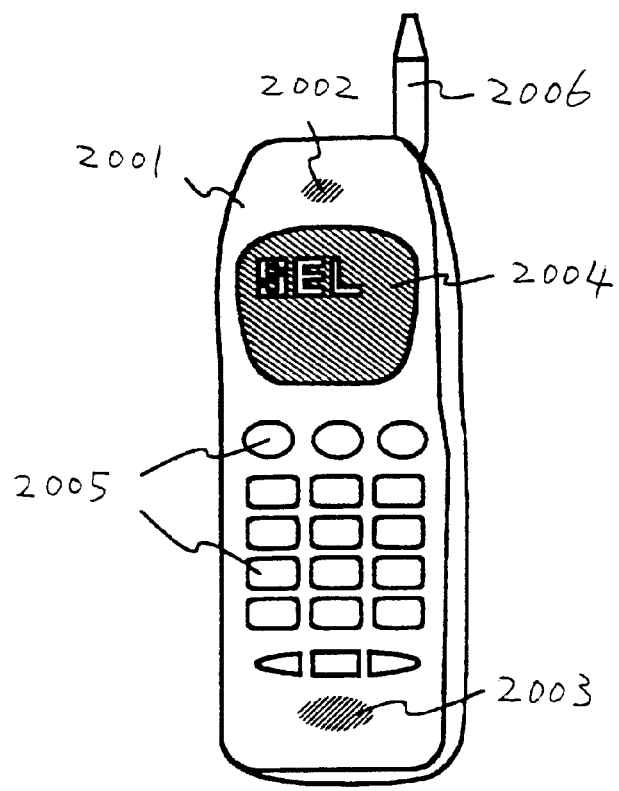
FIGS. 13A and 13B are diagrams showing examples of electronic equipment in accordance with Embodiment 11 of the present invention.

With now reference to FIG. 13A, a portable telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 13B:
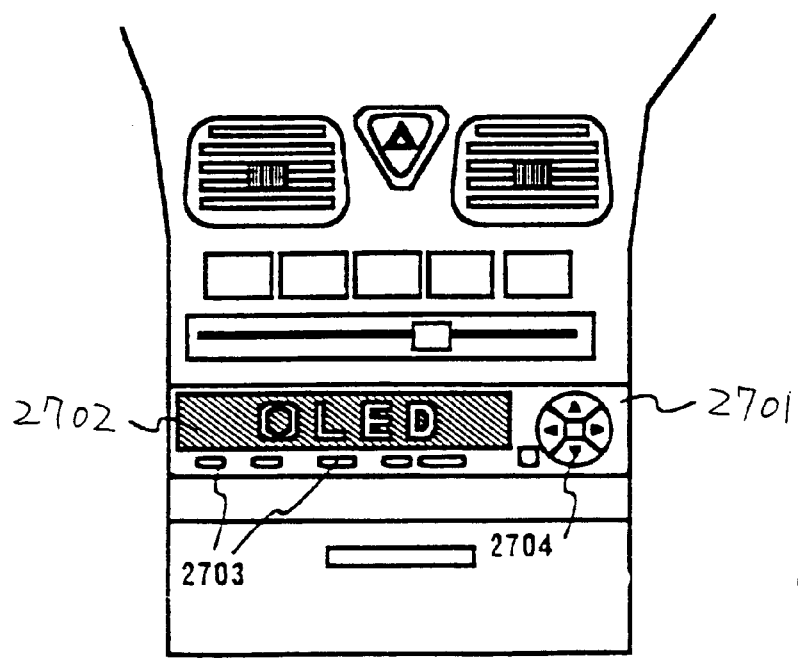

FIG. 13B illustrates a sound reproduction device, a car audio equipment in concrete term, which includes a main body 2701, a display portion 2702, and operation switches 2703 and 2704. The self-emission device in accordance with the present invention can be used as the display portion 2702. Although the car audio equipment of the mount type is shown in the present embodiment, the present invention is also applicable to an audio of the set type. The display portion 2702 can reduce power consumption by displaying white-colored characters on a black-colored background, which is particularly advantageous for the audio of the portable type.

As set forth above, the present invention can be applied variously to a wide range of electronic devices in all fields.

The electronic device in the present embodiment can be obtained by utilizing an EL display device having the configuration in which the structures in Embodiments 1 through 10 are freely combined.

As was described above, according to the present invention, the active matrix EL display device having a pixel structure that realizes a high aperture ratio without increasing the number of masks and the number of processes can be realized.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An electronic device, comprising a pixel region comprising a plurality of pixels, with each pixel comprising:
   a switching transistor;
   a current control transistor; and
   a light-emitting element;
   wherein said switching transistor comprises:
      a semiconductor layer provided over a substrate;
         a source region and a drain region provided in said semiconductor layer;
         a channel-forming region provided in said semiconductor layer between said source region and said drain region;
         a gate electrode provided over said channel-forming region with a gate insulating film therebetween;
         an interlayer insulating film provided over said gate electrode; and
         a gate wiring connected to said gate electrode, provided over said interlayer insulating film, and superimposed over at least said channel-forming region.

2. A device according to claim 1, wherein said semiconductor layer has a region which is overlapped by said gate wiring.

3. A device according to claim 2, wherein said region of said semiconductor layer which is overlapped by said gate wiring includes at least said channel-forming region.

4. A device according to claim 2, wherein said region of said semiconductor layer which is overlapped by said gate wiring includes at least a region existing between said channel-forming region and said drain region.

5. A device according to claim 2, wherein said region of said semiconductor layer which is overlapped by said gate wiring includes at least a region existing between said channel-forming region and said source region.

6. A device according to claim 2, wherein said semiconductor layer includes a plurality of channel-forming regions; and wherein said region of said semiconductor layer which is overlapped by said gate wiring includes at least a region existing between one of said channel-forming regions and another channel-forming region.

7. A device according to claim 1, wherein said electrode and said source wirings are made of the same material.

8. A device according to claim 1, wherein each of said gate wirings is formed of one of films each mainly containing an element selected from the group consisting of W, WSix, Al, Cu, Ta, Cr, Mo and poly-Si which is doped with impurity elements that impart a conductive type, or a laminate film formed of said films.

9. Electric equipment using said electronic device as claimed in claim 1, as a display portion for one selected from the group consisting of a personal computer, a video camera, a portable information terminal, a digital camera, a digital video disc player and an electronic play device.

10. An electronic device, comprising a pixel region comprising a plurality of pixels, with each pixel comprising:
- a switching transistor;
- a current control transistor;
- an erasing transistor; and
- a light-emitting element;
- wherein said switching transistor comprises:
  - a semiconductor layer provided over a substrate;
    - a source region and a drain region provided in said semiconductor layer;
    - a channel-forming region provided in said semiconductor layer between said source region and said drain region;
    - a gate electrode provided over said channel-forming region with a gate insulating film therebetween;
  - an interlayer insulating film provided over said gate electrode; and
  - a gate wiring connected to said gate electrode, provided over said interlayer insulating film, and superimposed over at least said channel-forming region.

11. Electric equipment using said electronic device as claimed in claim 10, as a display portion for one selected from the group consisting of a personal computer, a video camera, a portable information terminal, a digital camera, a digital video disc player and an electronic play device.

12. An electronic device, comprising a pixel region comprising a plurality of pixels, with each pixel comprising:
- a switching transistor;
- a current control transistor;
- an erasing transistor; and
- a light-emitting element;
- wherein said erasing transistor comprises:
  - a semiconductor layer provided over a substrate;
    - a source region and a drain region provided in said semiconductor layer;
    - a channel-forming region provided in said semiconductor layer between said source region and said drain region;
    - a gate electrode provided over said channel-forming region with a gate insulating film therebetween;
  - an interlayer insulating film provided over said gate electrode; and
  - a gate wiring connected to said gate electrode, provided over said interlayer insulating film, and superimposed over at least said channel-forming region.

13. A device according to claim 12, wherein said semiconductor layer has a region which is overlapped by said gate wiring.

14. A device according to claim 13, wherein said region of said semiconductor layer which is overlapped by said gate wiring includes at least said channel-forming region.

15. A device according to claim 11, further comprising a gate electrode, the gate electrode being a gate electrode of said current control transistor and being connected to a drain region of said switching transistor.

16. A device according to claim 12, wherein said first gate wiring and said second gate wiring are formed of one of films each mainly containing an element selected from the group consisting of W, WSix, Al, Cu, Ta, Cr, Mo and poly-Si which is doped with impurity elements that impart a conductive type, or a laminate film formed of said films.

17. Electric equipment using said electronic device as claimed in claim 12, as a display portion for one selected from the group consisting of a personal computer, a video camera, a portable information terminal, a digital camera, a digital video disc player and an electronic play device.

* * * * *